United States Patent [19]

Uchida

[11] Patent Number: 5,740,123
[45] Date of Patent: Apr. 14, 1998

[54] SEMICONDUCTOR INTEGRATED CIRCUIT FOR CHANGING PULSE WIDTH ACCORDING TO FREQUENCY OF EXTERNAL SIGNAL

[75] Inventor: Toshiya Uchida, Kawasaki, Japan

[73] Assignee: Fujitsu Limited, Kanagawa, Japan

[21] Appl. No.: 808,907

[22] Filed: Mar. 3, 1997

[30] Foreign Application Priority Data

Aug. 29, 1996 [JP] Japan .................................. 8-228323

[51] Int. Cl.$^6$ .................................................. G11C 7/00
[52] U.S. Cl. ...................................... 365/233; 365/194
[58] Field of Search ........................ 365/194, 73, 76, 365/77, 233; 327/158, 153, 161, 175

[56] References Cited

U.S. PATENT DOCUMENTS

| | | | |
|---|---|---|---|
| 5,313,422 | 5/1994 | Houston | 365/194 |
| 5,493,538 | 2/1996 | Bergman | 365/194 |
| 5,566,130 | 10/1996 | Durham et al. | 365/194 |

Primary Examiner—Vu A. Le
Attorney, Agent, or Firm—Nikaido, Marmelstein, Murray & Oram LLP

[57] ABSTRACT

A semiconductor integrated circuit has a primary delay controller for receiving an external control signal, at least one intermediate delay controller cascaded to the primary delay controller, and a final delay controller cascaded to the intermediate delay controller. The semiconductor integrated circuit further has a phase comparator and a pulse signal generator. The phase comparator compares a phase of the external control signal with a phase of an output signal of the final delay controller, and controls delays in the primary, intermediate, and final delay controllers in accordance with the comparison result. The pulse signal generator receives the external control signal and an output signal of any one of the primary and intermediate delay controllers, and provides a pulse signal whose pulse width is dependent on a period of the external control signal and a value specific to the received output signal. This semiconductor integrated circuit is able to change the pulse width of the pulse signal in response to a change in the frequency of the external clock signal.

14 Claims, 27 Drawing Sheets

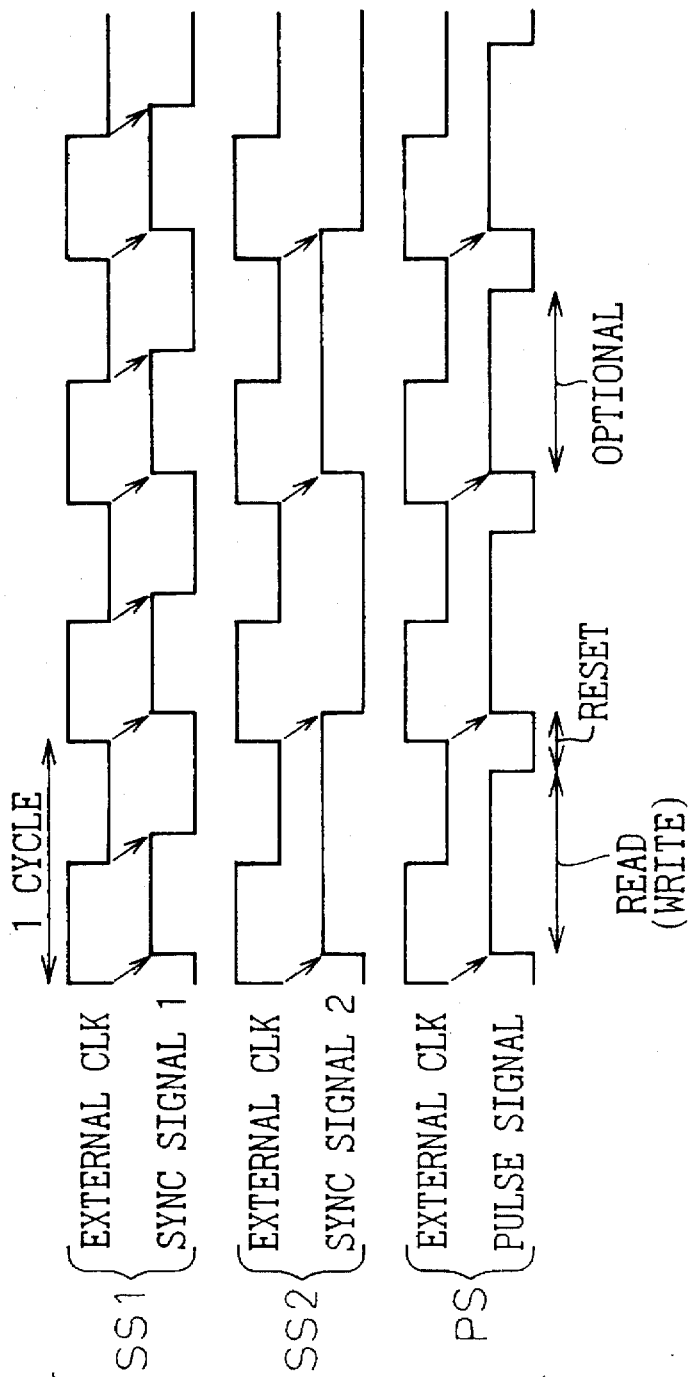
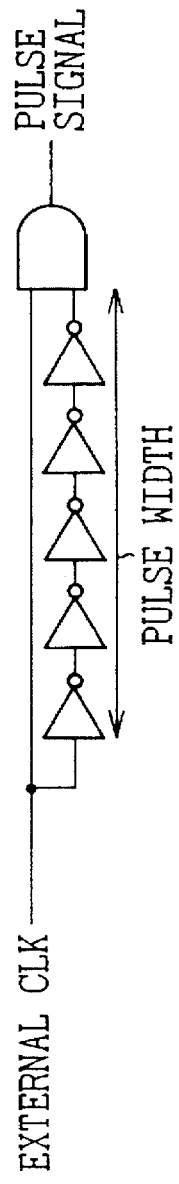

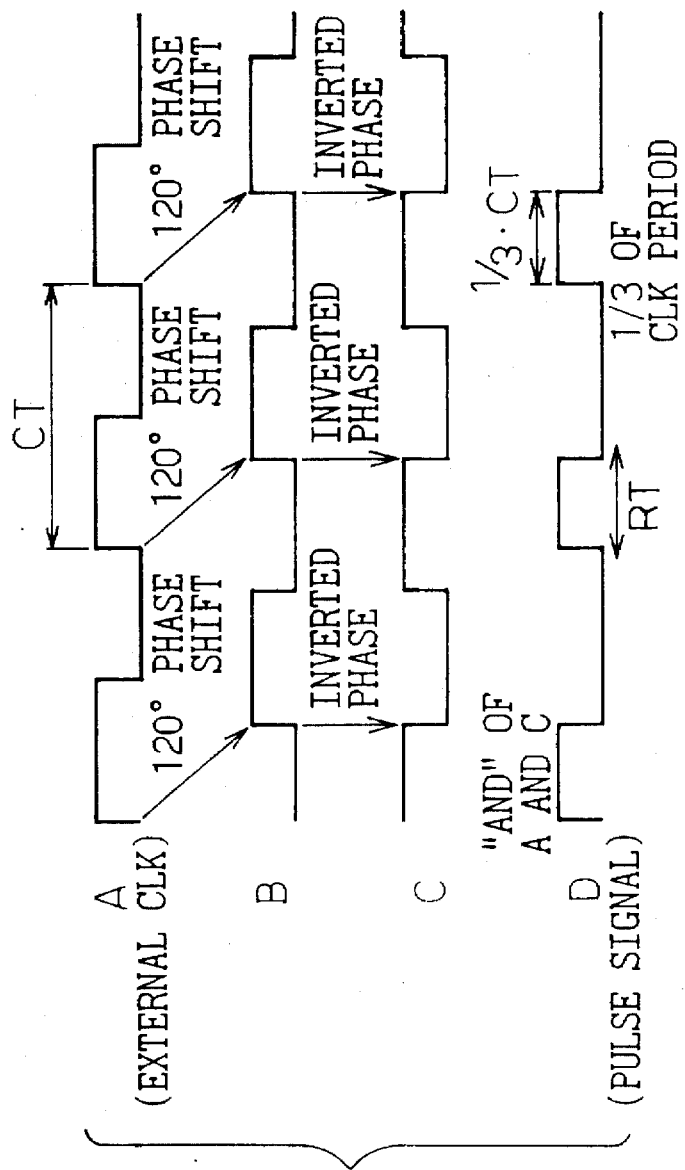
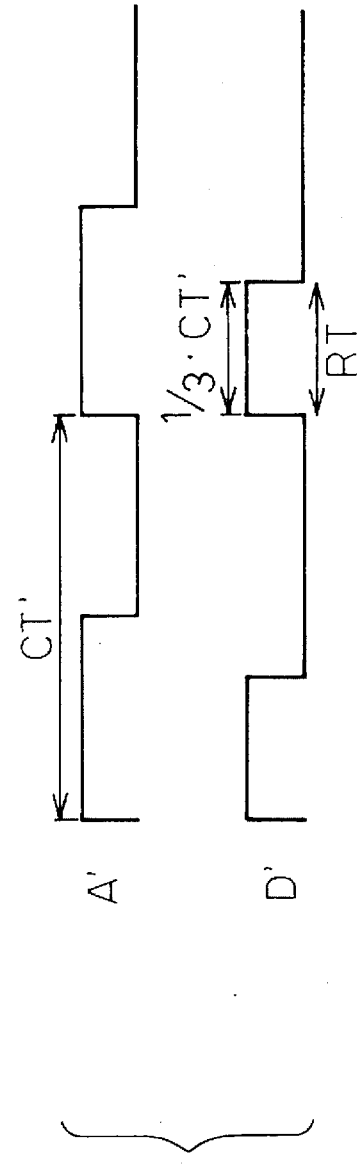

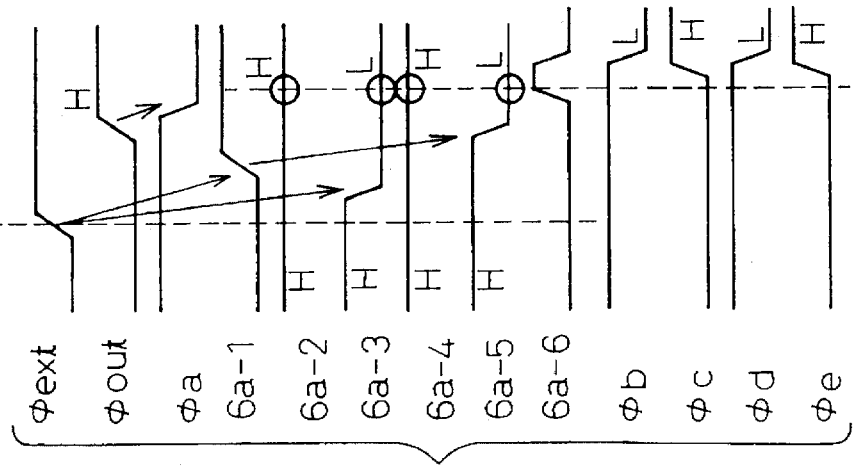
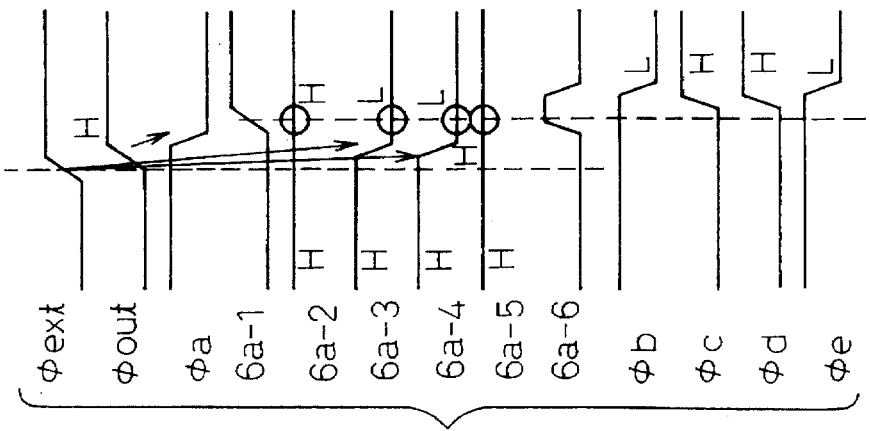
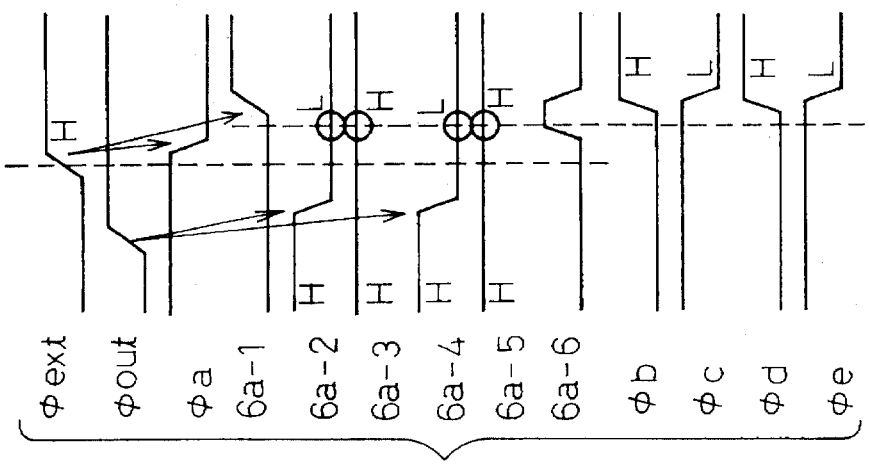

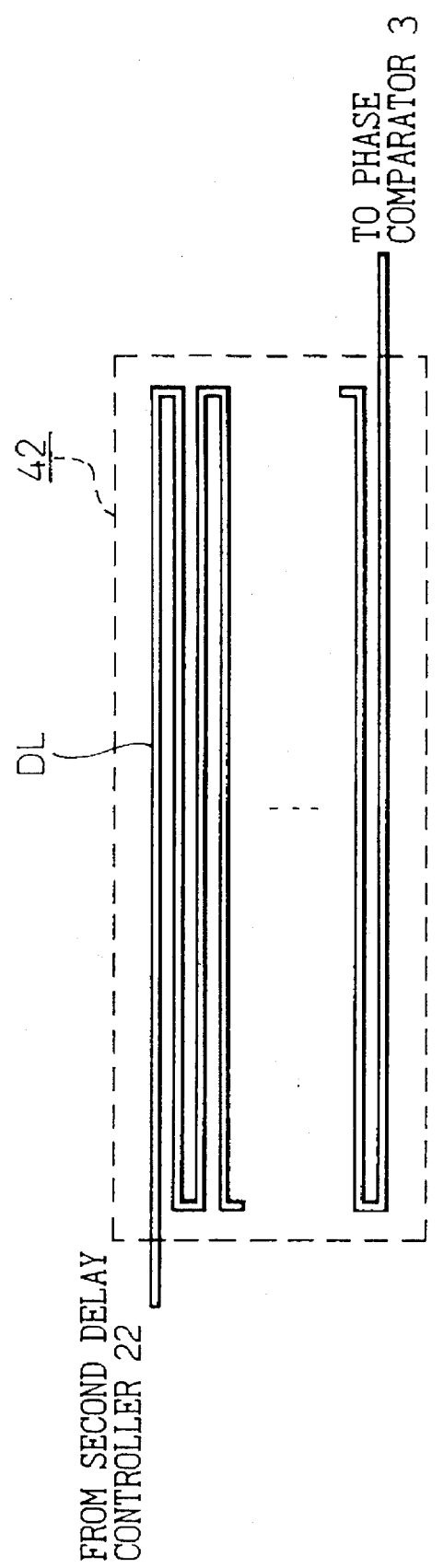

SEMICONDUCTOR INTEGRATED CIRCUIT FOR CHANGING PULSE WIDTH ACCORDING TO FREQUENCY OF EXTERNAL SIGNAL

BACKGROUND OF THE INVENTION

1. Field of the Invention

The present invention relates to a semiconductor integrated circuit, and more particularly to one capable of changing a pulse width according to a change in a frequency of an external control signal.

2. Description of the Related Art

Recently, very fine and highly integrated semiconductor circuits need various control signals. For example, some integrated circuits use not only signals synchronized with an external clock signal but also pulse signals whose periods are determined according to a rise or a fall of the external clock signal.

For example, a synchronous signal rises to high in response to a rising edge of an external clock signal and falls to low in response to a falling edge of the same. Further, a pulse signal rises to high in response to a rising edge of the external clock signal, maintains the high level for a given interval, and falls to low. The pulse width of the pulse signal is the interval during which the level of the signal is high. The pulse signal is generated by, for example, a pulse signal generator consisting of cascaded inverters whose delay time determines the pulse width of the pulse signal.

The high-level interval of the pulse signal is used for, for example, reading or writing data to or from a synchronous DRAM (SDRAM), and the low-level interval thereof is used for resetting or short-circuiting data lines of the SDRAM. Pulse signals are used not only for controlling the read, write, and reset operations of SDRAMs but also for controlling various functions of various semiconductor integrated circuits.

For these circuits, it is necessary to change the pulse width of each pulse signal according to a change in the frequency of the external clock signal.

The related arts and their associated problems will be described in detail later with reference to the accompanying drawings.

SUMMARY OF THE INVENTION

An object of the present invention is to change the pulse width of a pulse signal according to a change in the frequency of an external clock signal.

According to the present invention, there is provided a semiconductor integrated circuit comprising a primary delay controller for receiving an external control signal; at least one intermediate delay controller cascaded to the primary delay controller; a final delay controller cascaded to the intermediate delay controller; a phase comparator for comparing a phase of the external control signal with a phase of an output signal of the final delay controller, and for controlling delays in the primary, intermediate, and final delay controllers in accordance with the comparison result; and a pulse signal generator for receiving the external control signal and an output signal of any one of the primary and intermediate delay controllers, and for providing a pulse signal whose pulse width is dependent on a period of the external control signal and a value specific to the received output signal.

The phase comparator may control delays in the primary, intermediate, and final delay controllers so as to make the phase of an output signal of the final delay controller agree with a phase of the external control signal. The semiconductor integrated circuit may be a synchronous DRAM, and the pulse signal generated by the pulse signal generator may be a control pulse signal used to control read, write, and reset operation intervals of the synchronous DRAM. A duty factor of the pulse signal generated by the pulse signal generator may be determined by a ratio of the number of delay controllers between the primary delay controller and the intermediate delay controller that provides its own output to the pulse signal generator to the total number of the primary, intermediate, and final delay controllers.

According to the present invention, there is also provided a semiconductor integrated circuit comprising a phase delayed signal generator for receiving an external control signal and generating a phase delayed signal whose phase is delayed from that of the external control signal by a given value; and a pulse signal generator for receiving the external control signal and an output signal of the phase delayed signal generator and for generating a pulse signal whose pulse width is dependent on an period of the external control signal and a value specific to the received output signal.

The phase delayed signal generator may include a primary delay controller for receiving an external control signal; at least one intermediate delay controller cascaded to the primary delay controller; a final delay controller cascaded to the intermediate delay controller; and a phase comparator for comparing a phase of the external control signal with a phase of an output signal of the final delay controller, and for controlling delays in the primary, intermediate, and final delay controllers in accordance with the comparison result, wherein the phase delayed signal generator generates a phase delayed signal whose phase delay is determined according to the number of the primary, intermediate, and final delay controllers.

A duty factor of the pulse signal generated by the pulse signal generator may be determined by a ratio of the number of delay controllers between the primary delay controller and the intermediate delay controller that provides its own output to the pulse signal generator to the total number of the primary, intermediate, and final delay controllers. The semiconductor integrated circuit may be a synchronous DRAM, and the pulse signal generated by the pulse signal generator may be a control pulse signal used to control read, write, and reset operation intervals of the synchronous DRAM.

The semiconductor integrated circuit may further comprise a delay locked line circuit for receiving the output signal of the phase delayed signal generator and for generating a signal phase-synchronized with the received output signal. The delay locked line circuit may include first and second delay controllers for receiving an output signal of the primary delay controller; a plurality of object circuits for receiving an output signal of the first delay controller through a real line; a dummy line for producing a dummy delay corresponding to a delay in the real line; and a second phase comparator for comparing a phase of the output signal of the primary delay controller with a phase of a dummy output signal of the second delay controller provided through the dummy line, for controlling delays in the first and second delay controllers in accordance with the comparison result.

The delay locked line circuit may provide a synchronous signal that is in synchronization with the external control signal and is phase-shifted therefrom depending on the primary delay controller. The semiconductor integrated circuit may be a synchronous DRAM, and the synchronous signal provided by the delay locked line circuit may serve as an enable signal for a data output buffer circuit of the synchronous DRAM.

Further, according to the present invention, there is provided a semiconductor integrated circuit comprising a plurality of delay control circuits for dividing an external control signal; a pulse signal generating circuit for processing the external control signal and an output signal of a predetermined one of the delay control circuits and for providing a pulse signal whose pulse width is dependent on a period of the external control signal and a value specific to the output signal, so as to vary the pulse width of the pulse signal in response to a change in a frequency of the external control signal.

In addition, according to the present invention, there is also provided a semiconductor integrated circuit comprising cascaded "n" variable delay circuits for receiving a control pulse signal; a phase comparator for controlling a delay time of each of the "n" variable delay circuits so as to make a phase of an output signal each of the "n" variable delay circuits agree with a phase of the control pulse signal; and a pulse signal generator for receiving the control pulse signal and a selected one of output signals of the "n" variable delay circuits and for generating a pulse signal whose pulse width corresponds to a phase difference of the two received signals.

BRIEF DESCRIPTION OF THE DRAWINGS

The present invention will be more clearly understood from the description of the preferred embodiments as set forth below with reference to the accompanying drawings, wherein:

FIGS. 1A and 1B explain control signals used for a semiconductor integrated circuit;

FIGS. 7A and 7B are timing charts showing the operation of the circuit of FIG. 6;

FIGS. 17A to 17C show the operations of the phase comparing section of FIG. 16;

FIG. 27 shows a dummy line for transmitting a dummy internal clock signal in a semiconductor integrated circuit according to the present invention.

DESCRIPTION OF THE PREFERRED EMBODIMENTS

For a better understanding of the preferred embodiments of the present invention, a related art and the problem thereof will be explained.

Recent fine and highly integrated semiconductor circuits are designed to provide various functions with the use of various control signals. These circuits employ not only control signals synchronized with an external clock signal but also pulse control signals whose pulse widths are defined by a rise or a fall of the external clock signal.

FIG. 1A is a timing chart showing control signals used for a semiconductor integrated circuit, and FIG. 1B is a circuit diagram showing a pulse signal generator.

A synchronous signal SS1 rises to high in response to a rising edge of an external clock signal CLK and falls to low in response to a falling edge of the same. A synchronous signal SS2 rises to high in response to a first rising edge of the external clock signal CLK and falls to low in response to a second rising edge of the same.

A pulse signal PS rises to high in response to a rising edge of the external clock signal CLK, maintains the high level for a given interval, and falls to low. The pulse width of the pulse signal PS is the interval during which the level of the signal is high. The pulse signal PS is generated by, for example, the pulse signal generator of FIG. 1B consisting of cascaded inverters whose delay time determines the pulse width of the pulse signal PS.

The high-level interval of the pulse signal PS is used, for example, for reading or writing data to or from a synchronous DRAM (SDRAM), and the low-level interval thereof is used for resetting or short-circuiting data lines of the SDRAM. Pulse signals are used not only for controlling the read, write, and reset operations of SDRAMs but also for controlling various functions of various semiconductor integrated circuits.

Figure 2:
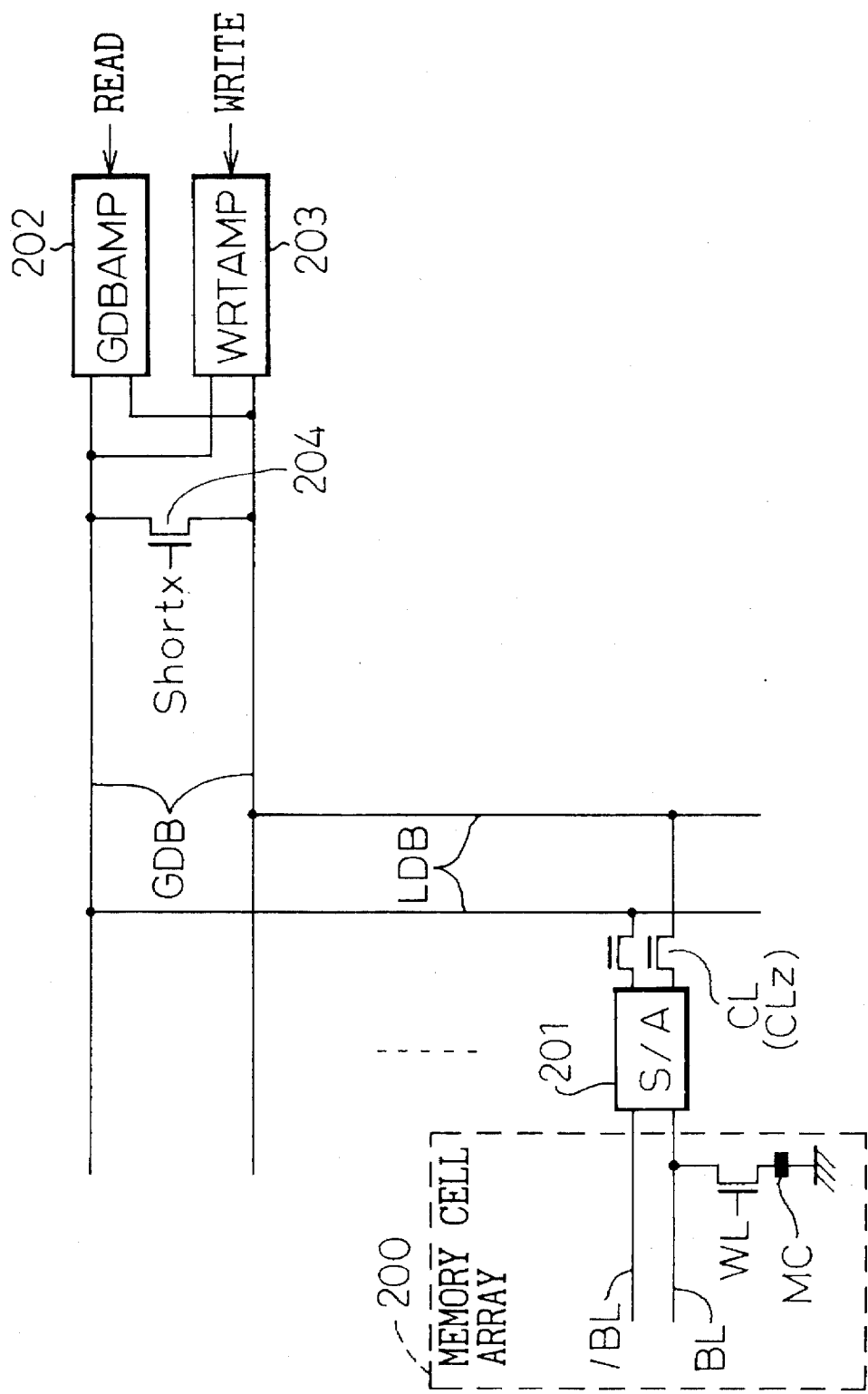
FIG. 2 schematically shows data buses of a synchronous DRAM.

FIG. 2 schematically shows data buses of a synchronous DRAM (SDRAM) to which the present invention is applicable. The SDRAM includes a memory cell array 200, sense amplifiers (S/As) 201, a read amplifier (GDBAMP) 202 for amplifying a signal in a global data bus (GDB), a write amplifier (WRTAMP) 203, and a short controlling transistor 204. The memory cell array 200 has word lines WLs, bit lines BLs and/BLs, and memory cells MCs. The memory cells are formed at intersections of the word and bit lines.

Figure 3A:
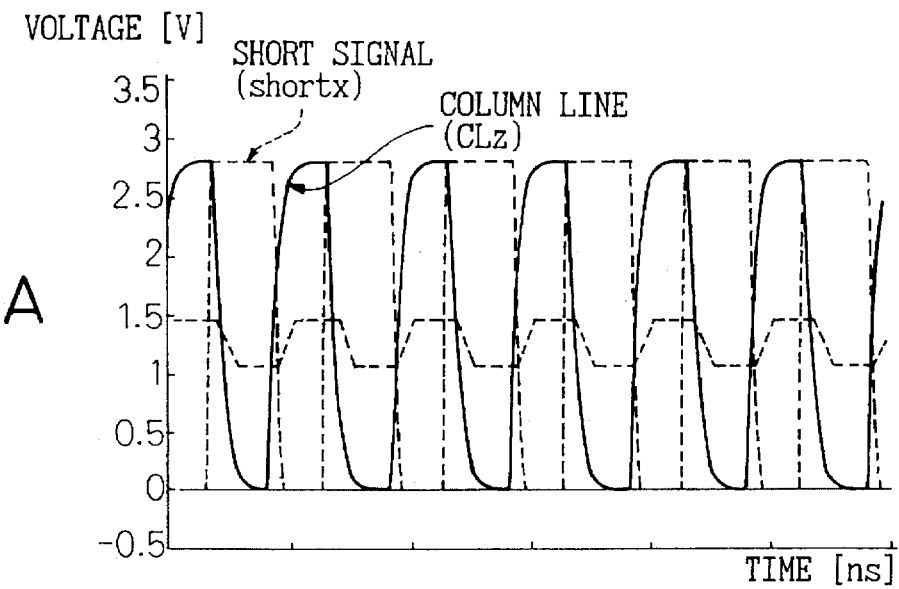
FIGS. 3A to 3C show continuous waveforms of a read operation of the synchronous DRAM.
Figure 3B:
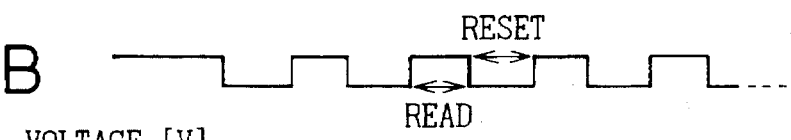
Figure 3C:
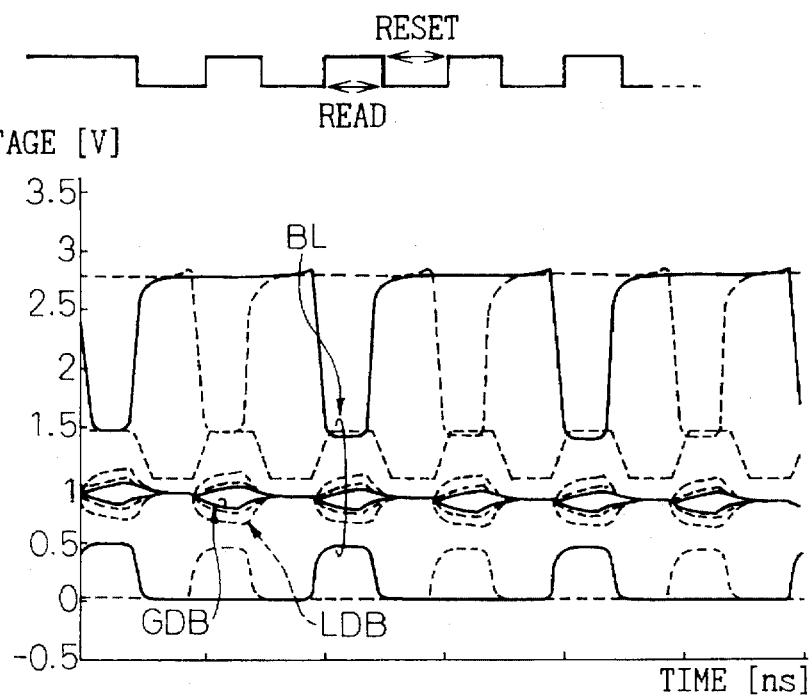

FIGS. 3A to 3C show continuous waveforms of a read operation of the SDRAM, in which FIG. 3A shows a short signal SHORTX for short-circuiting complementary signal lines and a signal CLz in a selected column line CL, FIG. 3B shows a pulse signal for controlling the read operation and a reset (short-circuiting) operation, and FIG. 3C shows levels in a local data bus LDB and the global data bus GDB during the read and reset operations.

In the read operation, the sense amplifier 201 amplifies discharge from the memory cell MC and provides data to the selected column line CL. The data is transmitted through the corresponding local data bus LDB and the global data bus GDB and is provided outside through the amplifier 202.

To realize high-speed data transmission, the data buses LDB and GDB consist each of complementary lines, which are precharged, i.e., reset to the same level. This level is generally lower than a source voltage. When successively carrying out read operations, the data buses are precharged and short-circuited whenever an access is made. The precharging and short-circuiting operations must not interfere with the next access.

In FIG. 3C, the global data bus GDB is activated with small amplitudes when carrying out successive read operations. The small amplitudes in the global data bus GDB are amplified by the amplifier 202, to transfer read data and shorten a reset operation for the next cycle.

Figure 4A:
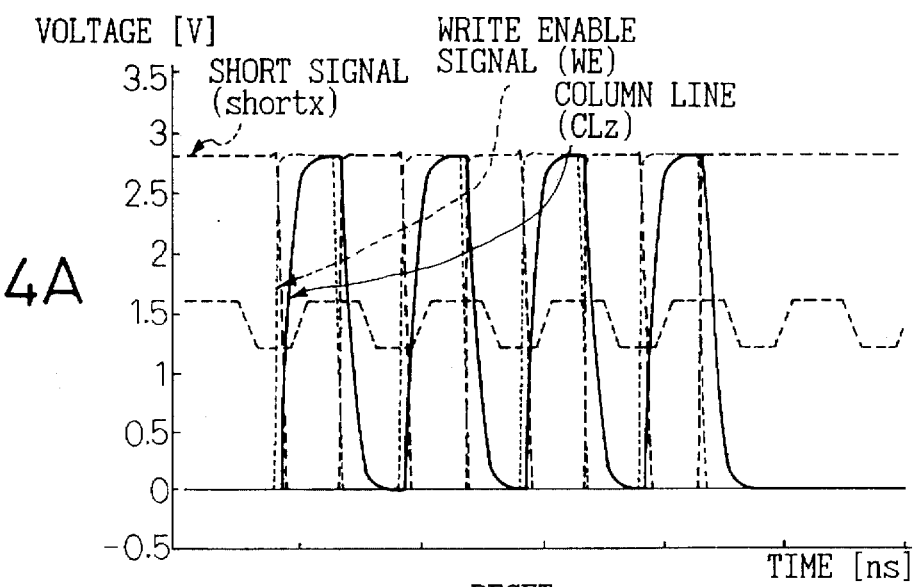
FIGS. 4A to 4C show continuous waveforms of a write operation of the synchronous DRAM.
Figure 4B:
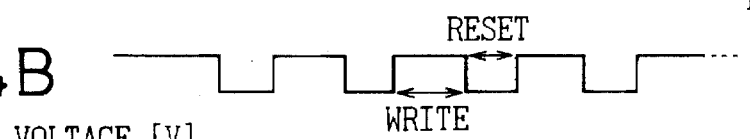
Figure 4C:
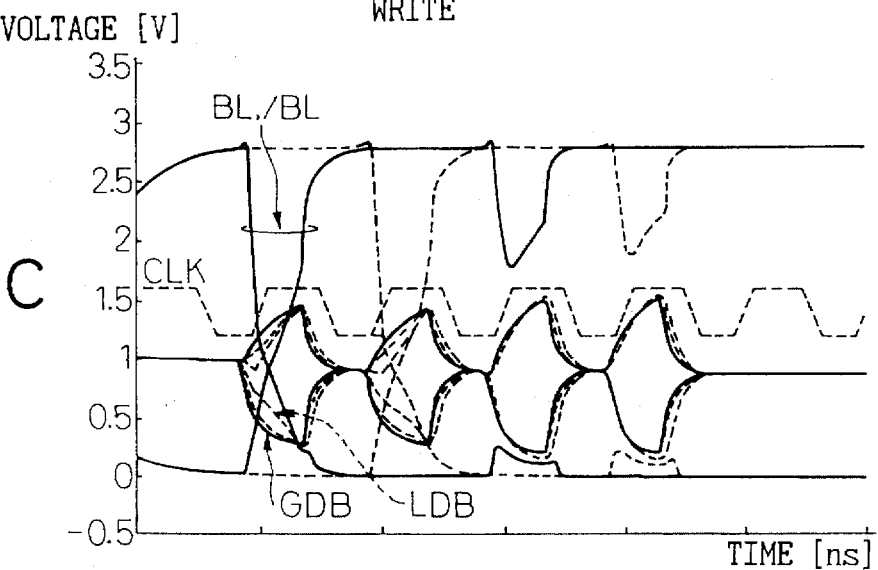

FIGS. 4A to 4C show continuous waveforms of a write operation of the SDRAM, in which FIG. 4A shows the short signal SHORTX for short-circuiting complementary signal lines and the signal CLz in the selected column line CL, FIG. 4B shows a pulse signal for controlling the write and reset operations, and FIG. 4C shows levels in the data buses LDB and GDB.

The write amplifier 203 sends charge to the memory cell MC through the data buses GDB and LDB and the sense amplifier 201. In the write operation, it is important to supply sufficient charge to the memory cell MC. Namely, a data transmitting level from the write amplifier 203 to the global data bus GDB must be as high as possible while securing a high-speed operation. As the data transmitting level from the amplifier 203 to the data bus GDB increases, a writing performance, i.e., a writing speed improves. On the other hand, a resetting interval must be short for the next read or write operation.

Accordingly, the SDRAM must carry out, in a single cycle time, a reset operation including precharging and short-circuiting operations, as well as a write or read operation through a selected column line and a corresponding sense amplifier.

The longer the periods for the reset and read/write operations, the more secure these operations. However, the longer the period for the reset operation, the shorter the period for the read/write operation. The reset, read, and write operations are carried out according to a pulse signal to which the present invention relates. Namely, the present invention is applied to a semiconductor integrated circuit that employs a pulse signal such as the control signal CLz for a selected column line whose high-level interval is used for writing/reading data and whose low-level interval is used for resetting data lines.

Unlike synchronous signals, the pulse signal is adjustable in its pulse width, i.e., high- and low-level intervals with the use of, for example, a delay circuit. The pulse signal, therefore, is used as a control signal not only for SDRAMs but also for other semiconductor integrated circuits.

Figure 5A:
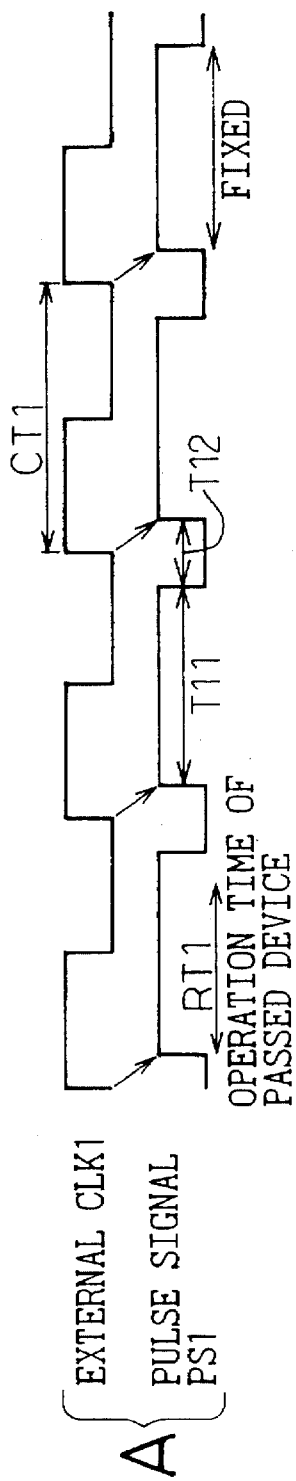
FIGS. 5A to 5C are timing charts showing the problem of a conventional semiconductor integrated circuit.
Figure 5B:
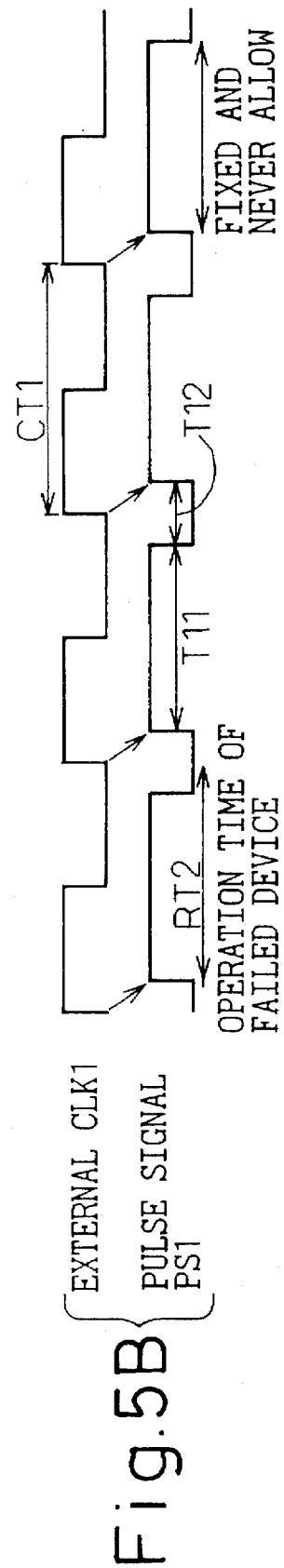
Figure 5C:
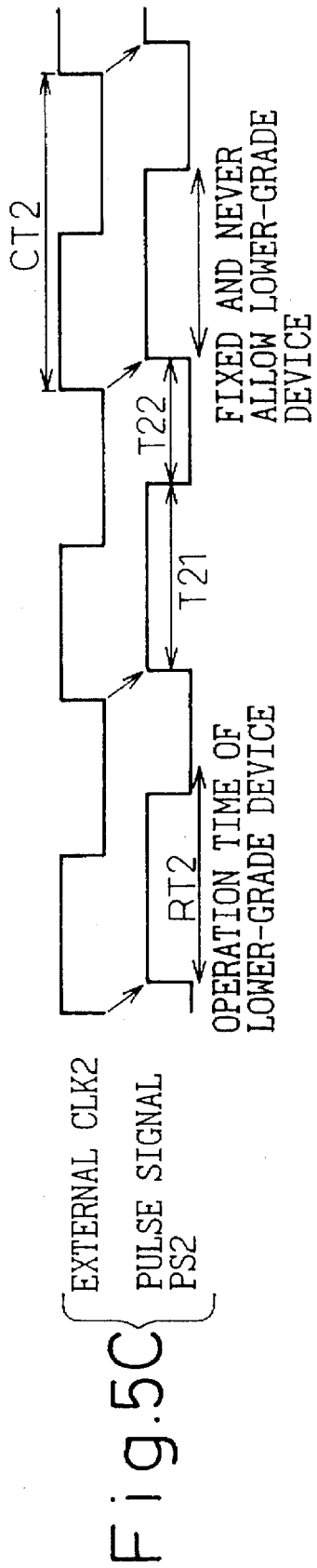

FIGS. 5A to 5C are timing charts showing the problem of a conventional semiconductor integrated circuit, in which FIG. 5A shows an external high-speed clock signal CLK1 having a given frequency and a pulse signal PS1 generated according to the clock signal CLK1 and used to control a maximum-speed semiconductor integrated circuit that satisfies required specifications, FIG. 5B shows the same signals used to control a lower-grade semiconductor integrated circuit that fails to satisfy the required specifications, and FIG. 5C shows an external clock signal CLK2 having a lower frequency and a pulse signal PS2 generated according to the clock signal CLK2 and used to control the lower-grade circuit.

In FIG. 5A, the maximum-speed circuit is driven according to the pulse signal PS1 generated according to the clock signal CLK1 having a period of CT1. An operation time RT1, for example, a read or write time of the maximum-speed circuit, which may be a synchronous DRAM, is shorter than a high-level interval T11 of the pulse signal PS1. Namely, the maximum-speed circuit is able to properly carry out a write or read operation according to the pulse signal PS1.

The operation speeds of semiconductor integrated circuits manufactured according to current technology show a normal distribution. Accordingly, the manufactured circuits usually involve maximum-speed circuits that provide designed performance as well as lower-grade circuits that do not provide the designed performance but may properly operate at a slower speed.

As shown in FIG. 5B, the lower-grade circuits need an operation time of RT2 that is longer than the high-level interval T11 of the pulse signal PS1, and therefore, are inoperable with the clock signal CLK1 and pulse signal PS1 prepared for the maximum-speed circuits.

In FIG. 5C, the external clock signal CLK2 has a lower frequency. In this case, the pulse width of a synchronous signal (for example, the synchronous signal 1 or 2 of FIG. 1A) based on the clock signal CLK2 may extend accordingly. However, a pulse width T21 of the pulse signal PS2 based on the clock signal CLK2 is equal to the pulse width T11 of the pulse signal PS1 based on the clock signal CLK1. This is because the pulse width of the pulse signal PS2 is determined by a delay gate array such as the one shown in FIG. 1B. Then, the pulse signal PS2 is improper for the lower-grade circuits. A low-level interval T22 of the pulse signal PS2 used for, for example, resetting an SDRAM is extended according to an extension (CT2−CT1) in the period of the clock signal, and therefore, is longer than a low-level interval T12 of the pulse signal PS1.

In this way, the related art fixes the pulse width of a pulse signal, and therefore, the pulse width is unchanged even if the period of an external clock signal is extended. As a result, the related art is incapable of reviving (applying) the lower-grade circuits that do not satisfy required specifications but may operate under lower-grade specifications. This deteriorates the yield of semiconductor device manufacturing.

Next, preferred embodiments of the present invention will be explained.

Figure 6:
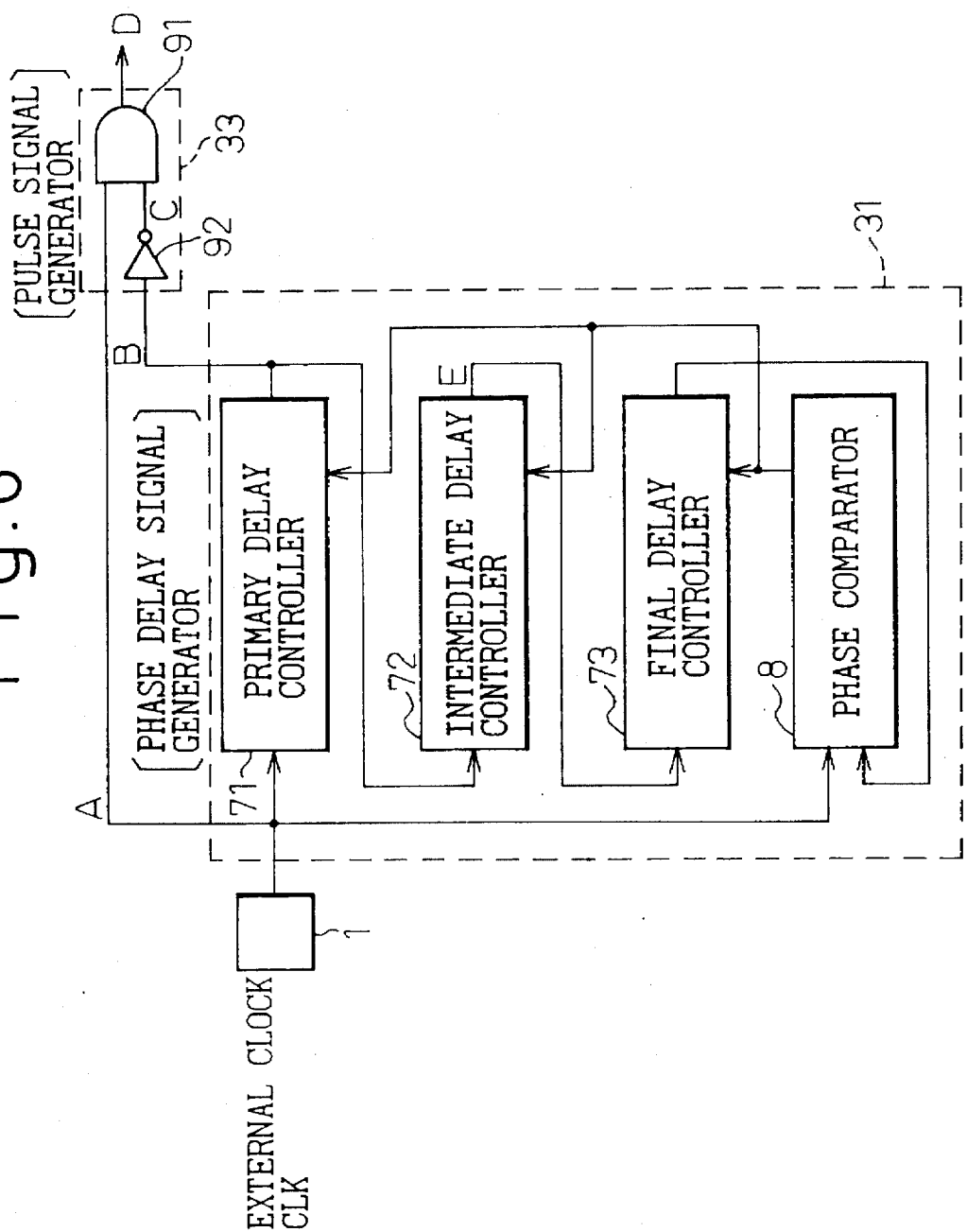
FIG. 6 is a block diagram showing a semiconductor integrated circuit according to an embodiment of the present invention.

FIG. 6 is a block diagram showing a semiconductor integrated circuit according to an embodiment of the present invention. The circuit has an input pad 1 for receiving an external clock signal CLK, a phase delayed signal generator 31, and a pulse signal generator 33.

The phase delayed signal generator 31 generates a signal whose phase is delayed by 120 degrees from the phase of the clock signal CLK. The pulse signal generator 33 generates a pulse signal whose high-level pulse width is ⅓ of a period CT of the clock signal CLK, according to the clock signal CLK (a signal A) and an output signal (a signal B) of the phase delayed signal generator 31.

The phase delayed signal generator 31 has cascaded primary, intermediate, and final delay controllers 71, 72, and 73 and a phase comparator 8. The phase comparator 8 compares the phase of the clock signal CLK with the phase of an output signal of the final delay controller 73, and according to the comparison result, controls delays in the delay controllers 71 to 73. Although the embodiment employs one intermediate delay controller 72, an optional number of intermediate delay controllers may be employed depending on a required pulse width.

The phase comparator 8 receives the external clock signal CLK and the output signal of the final delay controller 73 and controls delays in the delay controllers 71 to 73 so that there is no difference between the phases of the received signals. More precisely, each period of the clock signal CLK is equally divided by the delay controllers 71 to 73 so that the primary delay controller 71 provides a signal whose phase is 120 degrees behind that of the clock signal CLK, the intermediate delay controller 72 provides a signal whose phase is 240 degrees behind the same, and the final delay controller 73 provides a signal whose phase is 360 degrees behind the same. Namely, the signal provided by the final delay controller 73 is in synchronization with and one clock behind the clock signal CLK. In this way, the delay controllers provide signals having respective delays. The signal supplied to the input pad 1 is not limited to the external clock signal CLK. It may be any kind of pulse control signal. The number of the delay controllers (71, 72, 73) is not limited to three and isoptional.

In FIG. 7A, an AND gate 91 of the pulse signal generator 33 receives the signal A, i.e., the external clock signal CLK as well as a signal C which is an inversion of the signal B of the primary delay controller 71 passed through an inverter 92. The AND gate 91 provides, as an output signal of the pulse signal generator 33, a pulse signal whose pulse width is ⅓ of the period CT of the clock signal CLK.

In FIG. 7B, an external clock signal A' has a longer period CT' than the signal A whose period is CT. In this case, the pulse signal generator 33 provides an output signal D' whose pulse width is ⅓ of the period CT' of the signal A'. In this way, the pulse signal generator 33 of the present invention is capable of changing the pulse width of an output pulse signal (D) in response to a change in the frequency of an external clock signal (CLK).

Even if there is a lower-grade semiconductor integrated circuit having an operation time RT that is longer than the pulse width (⅓·CT) of the pulse signal D generated from the high-speed clock signal A, the present invention may employ the signal A' whose frequency is lower than that of the clock signal A. The signal A' is used to form the pulse signal D' having a pulse width of ⅓·CT' that is longer than the operation time RT of the lower-grade circuit. As a result, the lower-grade circuit operates normally. Lower-grade semiconductor integrated circuits that are unavoidably produced according to current manufacturing technology are thus revived usable by the present invention.

As explained above, the present invention does not fix the pulse width of a pulse signal. Instead, the present invention changes the pulse width in response to a change in the frequency of an external clock signal. Namely, the present invention sets the pulse width to several percents of or a fraction of the period of the external clock signal.

Figure 8:
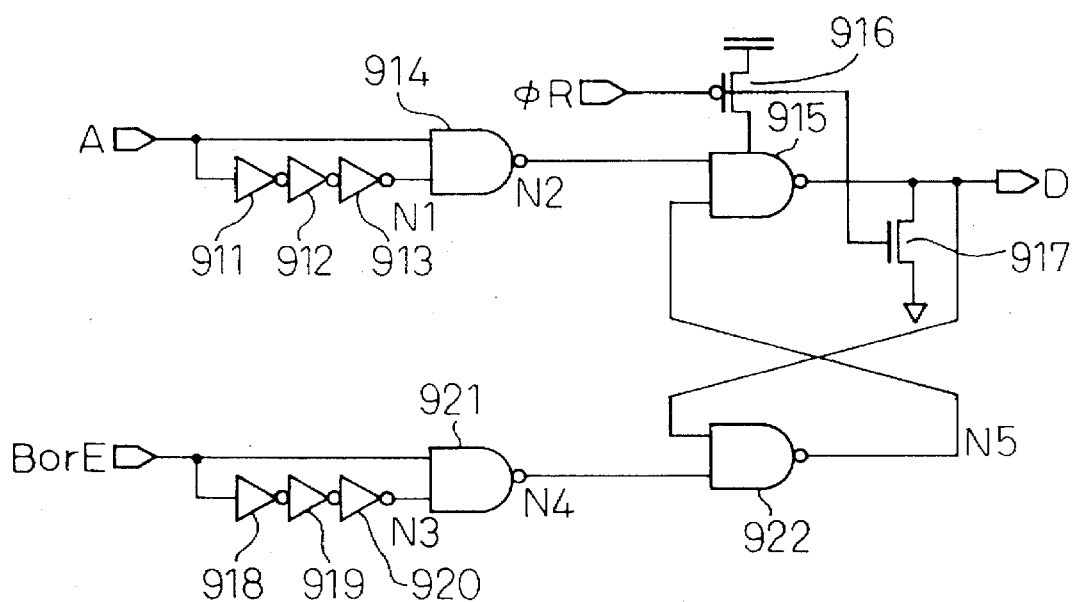
FIG. 8 is a circuit diagram showing a modification of a pulse signal generator of the circuit of FIG. 6.
Figure 9:
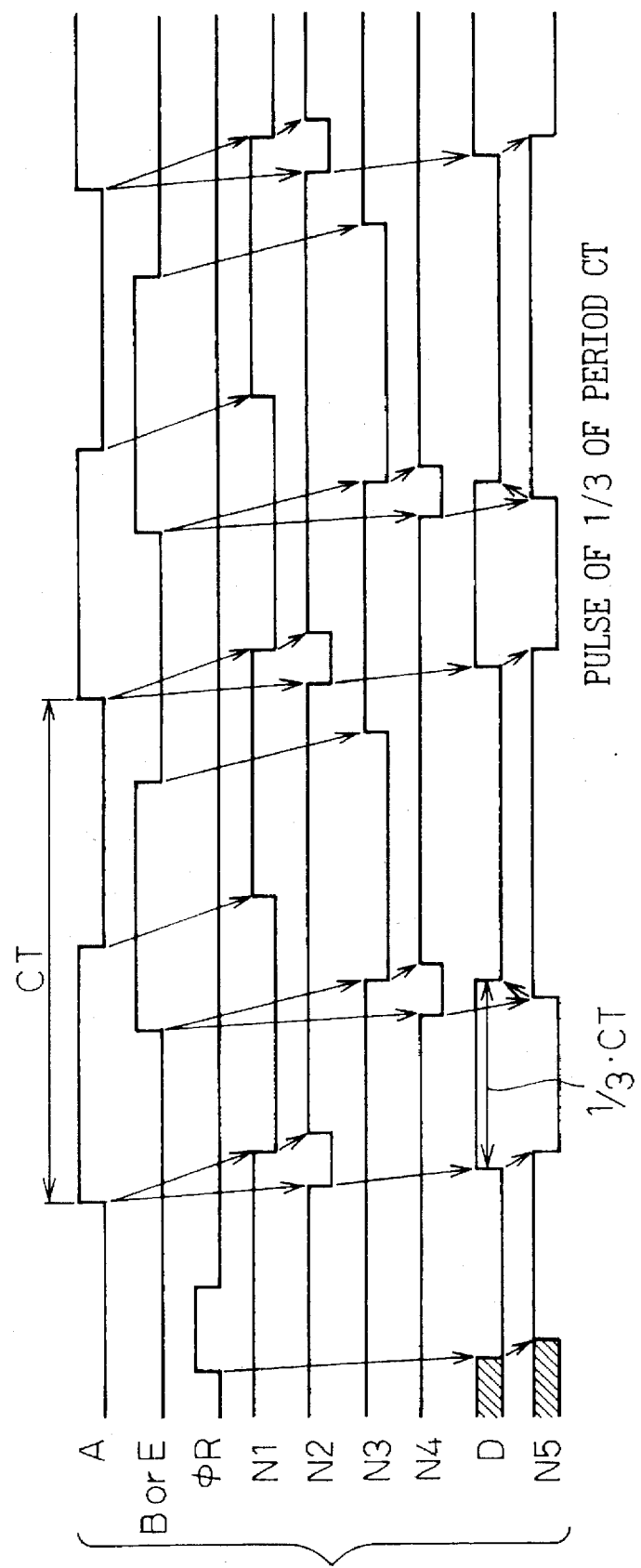
FIG. 9 is a timing chart showing an operation of the pulse signal generator of FIG. 8.
Figure 10:
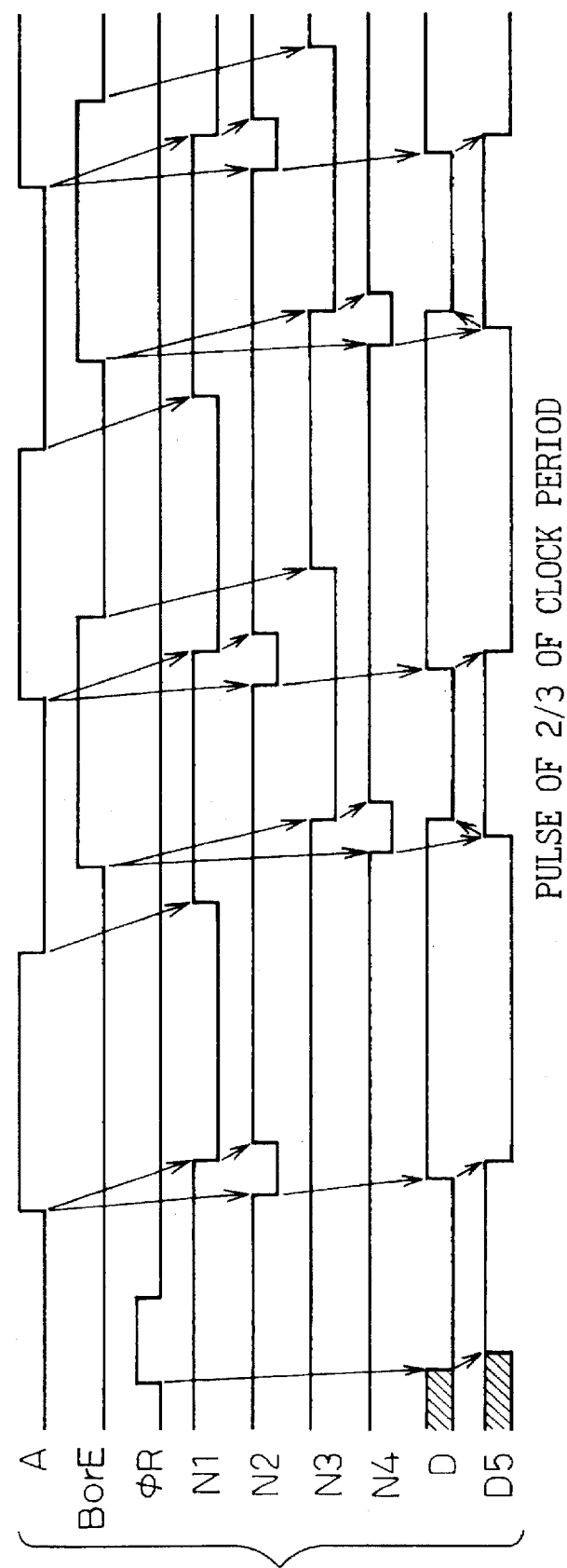
FIG. 10 is a timing chart showing another operation of the pulse signal generator of FIG. 8.

FIG. 8 is a circuit diagram showing a modification of the pulse signal generator 33 of FIG. 6, and FIGS. 9 and 10 are timing charts showing the operations of the circuit of FIG. 8.

The pulse signal generator 33 of FIG. 8 may employ an output signal E of the intermediate delay controller 72 of FIG. 6 instead of the output signal B of the primary delay controller 71 and generates a pulse signal D whose pulse width is ⅔ of the period of the external clock signal CLK.

The pulse signal generator 33 of FIG. 8 has inverters 911 to 913 and 918 to 920, NAND gates 914, 915, 921, and 922, a p-channel MOS transistor 916, and an n-channel MOS transistor 917. The signal A, i.e., the external clock signal CLK is supplied to the NAND gate 914 directly and through the inverters 911 to 913. The NAND gate 914 provides a signal N2 whose low-level pulse width corresponds to a delay achieved by the cascaded inverters 911 to 913. The signal B or E is supplied to the NAND gate 921 directly and through the inverters 918 to 920. The NAND gate 921 provides a signal N4 whose low-level pulse width corresponds to a delay achieved by the cascaded inverters 918 to 920.

When the output signal B of the primary delay controller 71 is supplied to the NAND gate 921, the output signal N4 of the NAND gate 921 falls 120 degrees after a fall of the output signal N2 of the NAND gate 914, as shown in FIG. 9. When the output signal E of the intermediate delay controller 72 is supplied to the NAND gate 921, the output signal N4 falls 240 degrees after a fall of the output signal N2, as shown in FIG. 10.

The output signal N2 is supplied to the NAND gate 915, and the output signal N4 is supplied to the NAND gate 922. The NAND gate 922 provides an output signal N5 to the NAND gate 915. The NAND gate 922 receives the output signal D of the NAND gate 915, i.e., the output signal of the pulse signal generator 33. The NAND gate 915 is connected to a high-potential power source through the p-channel transistor 916, which is controlled according to a reset signal R. The NAND gate 915 is also connected to a low-potential power source through the n-channel transistor 917, which is controlled according to the reset signal R.

In FIG. 9, the output signal D of the NAND gate 915, i.e., the output signal of the pulse signal generator 33 is reset to low by the transistor 917 that is turned on in response to the reset signal R. The output signal D is changed to high in response to a fall of the output signal N2 of the NAND gate 914. When the output signal N4 of the NAND gate 921 falls, the output signal N5 of the NAND gate 922 changes to high. As a result, the output signal D changes to low. If the output signal B of the primary delay controller 71 is supplied to the NAND gate 921, the output signal D has a high-level pulse width of one third of the period CT of the external clock signal CLK (A).

In FIG. 10, the output signal B of the intermediate delay controller 72 is supplied to the NAND gate 921. Then, the output signal D has a high-level pulse width of two thirds of the period CT of the external clock signal CLK (A). The number of the intermediate delay controller 72 in the phase delayed signal generator 31 is not limited to one. There may be a plurality of intermediate delay controllers 72. In this case, an output signal of any one of the primary and intermediate delay controllers is supplied to the NAND gate 921 to provide a pulse signal having a required pulse width. Namely, the duty factor of a pulse signal generated by the pulse signal generator 33 is determined according to the ratio of the number of delay controllers between the primary delay controller and the intermediate delay controller that provides its own output to the pulse signal generator 33 to the total number of the delay controllers. The structure of the pulse signal generator 33 is not limited to those of FIGS. 6 and 8. The number of the intermediate delay controllers and the total number of the delay controllers are not limited to those mentioned above.

Figure 11:
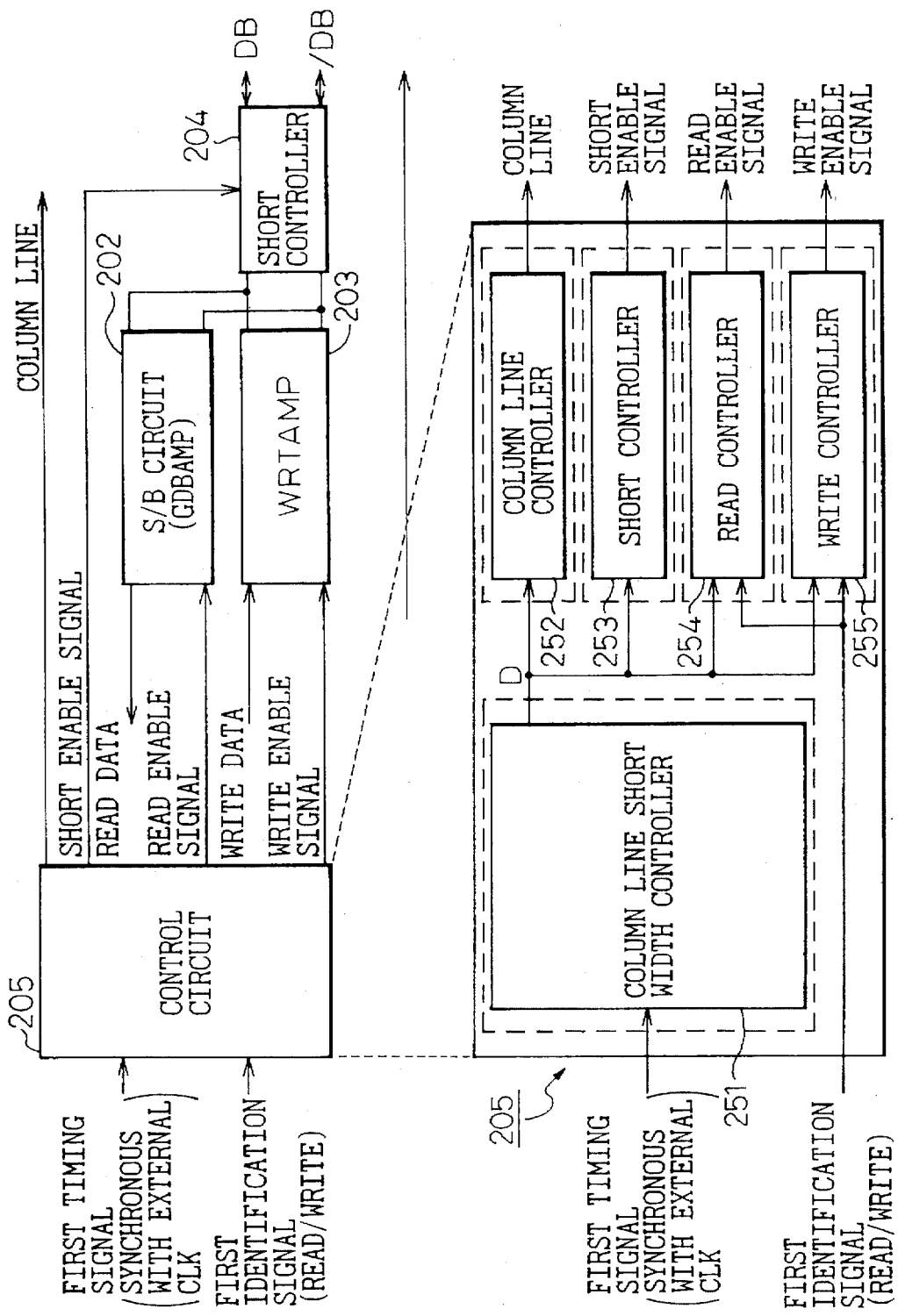
FIG. 11 is a block diagram showing a synchronous DRAM to which the present invention is applied.

FIG. 11 is a block diagram showing a synchronous DRAM (SDRAM) as an example of a semiconductor integrated circuit according to the present invention. The SDRAM has an S/B circuit or a read amplifier (GDBAMP) 202, a write amplifier (WRTAMP) 203, a short controller (short controlling transistor) 204, and a control circuit 205.

The control circuit 205 has a column line short width controller 251, a column line controller 252, a short controller 253, a read controller 254, and a write controller 255. The controller 251 corresponds to the circuit of the present invention of FIG. 6. The controller 251 receives a first timing signal synchronized with an external clock signal CLK and provides a pulse signal D whose pulse width is changed according to a change in the frequency of the first timing signal, to the controllers 252 to 255.

The column line controller 252 receives the pulse signal D and provides a column line activation signal CLz. The short controller 253 receives the pulse signal D and provides a short enable signal for controlling the short controlling transistor 204. The read controller 254 receives the pulse signal D and a read/write identification signal and provides a read enable signal for controlling the read amplifier 202. The write controller 255 receives the pulse signal D and read/write identification signal and provides a write enable signal for controlling the write amplifier 203.

For example, the first timing signal (the external clock signal CLK) has a period of 6 nsec, a column line activation time (read or write operation time) is 4 nsec, and a short time is 2 nsec. To achieve these periods, the duty factor of the pulse signal D is set to drive maximum-speed SDRAMs that meet design specifications. To drive lower-grade SDRAMs, the period of the external clock signal CLK is extended to 9 nsec. Then, the column line activation time becomes 6 nsec, and the short time is changed to 3 nsec. As a result, the read/write operation time is extended to properly use the lower-grade products at a lower speed.

Figure 12:
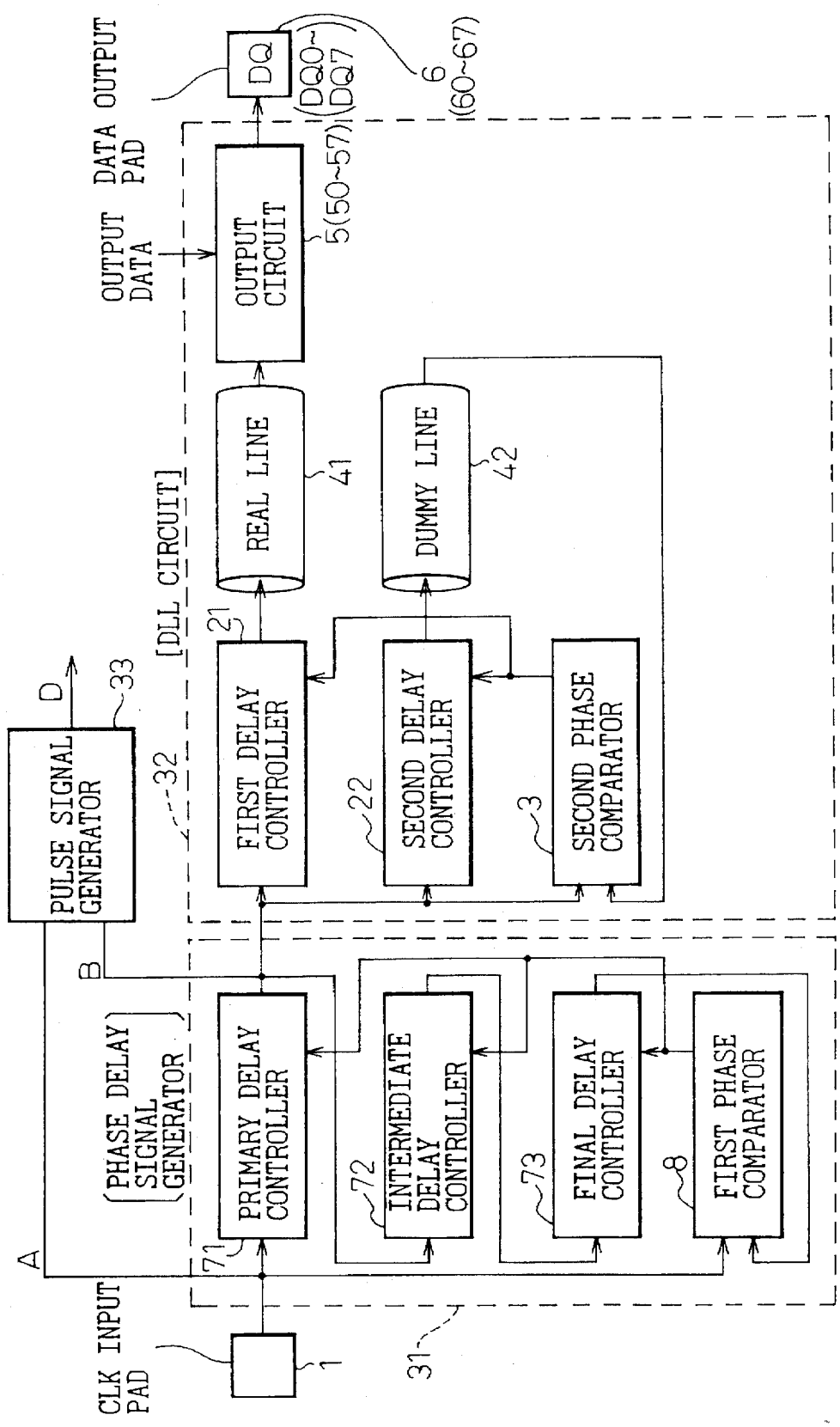
FIG. 12 is a block diagram showing a semiconductor integrated circuit according to another embodiment of the present invention.

FIG. 12 is a block diagram showing a semiconductor integrated circuit according to another embodiment of the present invention. Compared with the embodiment of FIG. 6, the embodiment of FIG. 12 additionally has a delay-locked line (DLL) circuit 32 which receives an output signal B from a phase delayed signal generator 31.

The phase delayed signal generator 31 has a first phase comparator 8. A pulse signal generator 33 is one of those of FIGS. 6 to 10. The circuit of FIG. 12 further has an output circuit 5 which provides read data, a data output pad 6 (DQ, DQ0 to DQ7), a second phase comparator 3, first and second delay controllers 21 and 22 whose delays are controlled according to the output of the phase comparator 3, a real line 41 extending between the delay controller 21 and the output circuit 5 (50 to 57), for transmitting an internal clock signal, and a dummy line having the same wiring load as the real line 41, for transmitting a dummy internal clock signal.

There are a plurality of output circuits 50 to 57 and data output pads 60 to 67.

In the DLL circuit 32, the second phase comparator 3 compares the phase of a first input signal (supplied also to the delay controllers 21 and 22) with the phase of a second input signal, and according to the comparison result, controls delays in the delay controllers 21 and 22 so that the second signal is delayed behind the first signal by one clock. As a result, the internal clock signal to the output circuit 5 is delayed by one clock behind an output signal D whose phase is 120 degrees behind the phase of the external clock signal CLK. As a result, there will be no apparent propagation delay in the real line 41. The output circuit 5 corresponds to, for example, an output buffer circuit of an SDRAM, and the signal supplied to the output circuit 5 through the delay controller 21 and real line 41 corresponds to an enable signal for the output buffer circuit. The first phase comparator 8 has the same structure as the second phase comparator 3. Primary, intermediate, and final delay controllers 71 to 73 and the first and second delay controllers 21 and 22 have the same structure except the number of delay units that determine a delay time.

Figure 13B:
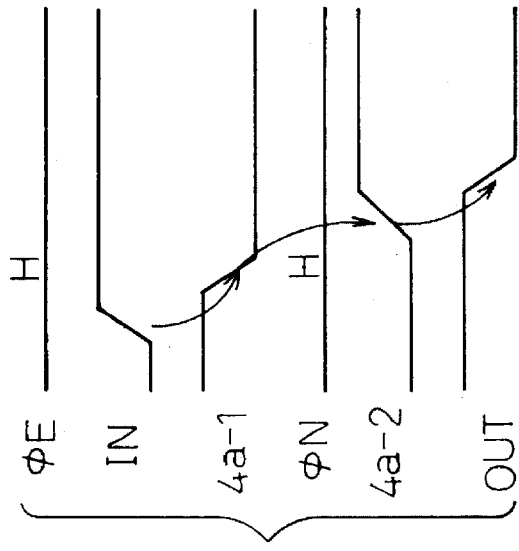
FIGS. 13A to 13C show a delay section of a delay controller of the circuit of FIG. 12.
Figure 13A:
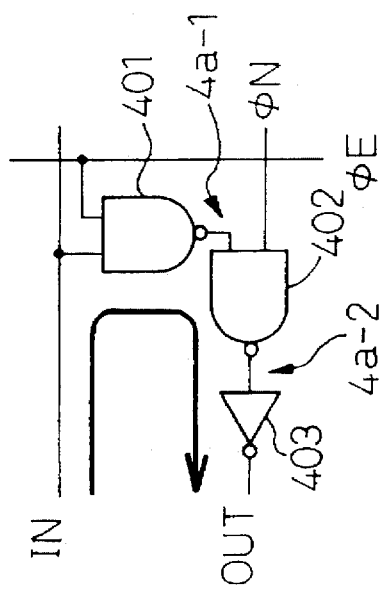
Figure 13C:
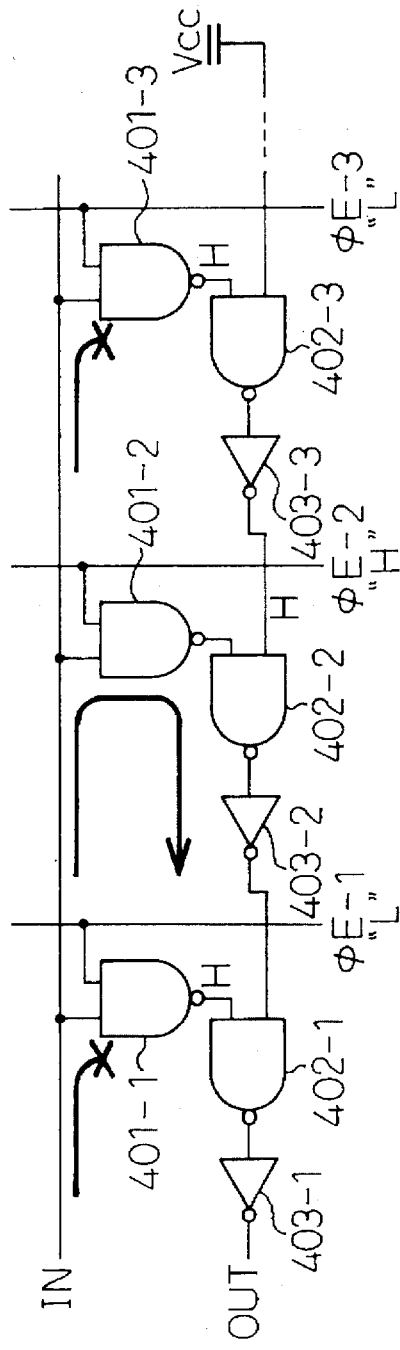

FIGS. 13A to 13C show a delay section of any one of the delay controllers 71, 72, 73, 21, and 22, in which FIG. 13A shows a 1-bit delay element, FIG. 13B is a time chart showing the operation of the 1-bit delay element, and FIG. 13C shows cascaded 1-bit delay elements.

The 1-bit delay element has two NAND gates 401 and 402 and an inverter 403. An enable signal $\phi E$ is high in FIG. 13B to activate the 1-bit delay element. The 1-bit delay element receives an input signal IN and a signal $\phi N$, which is an output signal of another 1-bit delay element on the right side, and provides an output signal OUT. Nodes 4a-1 and 4a-2 provide waveforms shown in FIG. 13B. The output signal OUT is a signal $\phi N$ to another 1-bit delay element on the left side.

When the signal $\phi N$ is low, the output signal OUT is always low. If the signal $\phi N$ is high and the signal $\phi E$ is low, the output signal OUT is high. If the signal $\phi N$ is high with the signal $\phi E$ being high and the input signal IN being low, the output signal OUT is high, and with the input signal IN being high, the output signal OUT is low.

If the input signal IN rises with the enable signal $\phi E$ being high, the input signal IN is transmitted through a path indicated with an arrow mark. If the enable signal $\phi E$ is low, the input signal IN is blocked from the path.

In FIG. 13C, the 1-bit delay elements are cascaded to form the delay section of the delay controller. Although FIG. 13C shows only three 1-bit delay elements, many elements are cascaded in reality, and each element is provided with a signal line such as $\phi E$-1, $\phi E$-2, or $\phi E$-3 each for transmitting an enable signal $\phi E$. These enable signals are controlled by a control section of the delay controller.

In FIG. 13C, the enable signal $\phi E$-2 is high to activate the center 1-bit delay element. If the input signal IN changes from low to high, the NAND gates 401-1 and 401-3 of the left and right 1-bit delay elements block the input signal IN because their enable signals $\phi E$-1 and $\phi E$-3 are each low.

On the other hand, the NAND gate 401-2 of the center 1-bit delay element passes the input signal IN because its enable signal $\phi E$-2 is high. The NAND gate 402-2 thereof also passes the input signal IN because the output signal OUT ($\phi N$) of the right 1-bit delay element is high. Then, the center 1-bit delay element provides the output signal OUT of low. If the output signal OUT ($\phi N$) of the right 1-bit delay element is low, the output signal OUT of the 1-bit delay element that receives the output signal is always low. Accordingly, the output signal OUT of the center 1-bit delay element is transmitted through the NAND gate and inverter of the left 1-bit delay element and is provided as a final output signal.

In this way, the input signal IN is transmitted through an activated 1-bit delay element, to form a final output signal. Namely, controlling the enable signal $\phi E$ of a required 1-bit delay element to high will control a delay in the delay controller. The delay of a 1-bit delay element is determined by the total signal propagation time of the NAND gates and inverter of the element and forms a unit delay time. A total delay time is calculated by multiplying the number of 1-bit delay elements passed by the input signal IN by the unit delay time.

Figure 14:
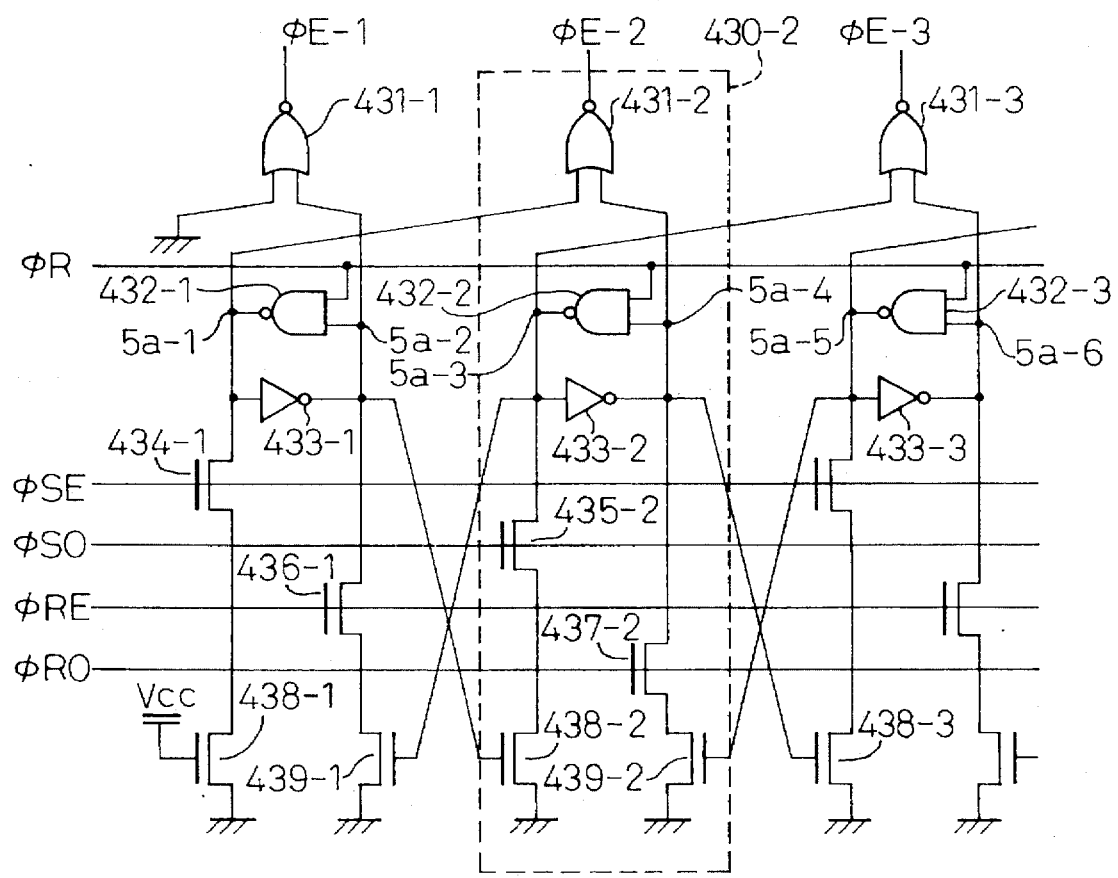
FIG. 14 shows a control section of the delay controller of the circuit of FIG. 12.

FIG. 14 shows a control section of the delay controller 71 (72, 73, 21, 22) of the present invention.

The control section consists of 1-bit control elements among which one surrounded with a dotted line in FIG. 14 is a 1-bit control element 430-2. Each element provides an enable signal $\phi E$ to a corresponding one of the 1-bit delay elements (FIG. 13).

The 1-bit control element 430-2 consists of a flip-flop having a NAND gate 432-2 and an inverter 433-2, transistors 435-2, 437-2, 438-2, and 439-2, and a NOR gate 431-2. The gate of the transistor 438-2 is connected to a node 5a-2 of a front 1-bit control element. The gate of the transistor 439-2 is connected to a node 5a-5 of a rear 1-bit control element. incremental signals, i.e., set signals $\phi SE$ and $\phi SO$ and decremental signals, i.e., reset signals $\phi RE$ and $\phi RO$ are connected alternately to the 1-bit control elements.

In the center 1-bit control element 430-2, the gate of the transistor 435-2 receives the set signal $\phi SO$, and the gate of the transistor 437-2 receives the reset signal $\phi RO$. The gates of the corresponding transistors of the front and rear 1-bit control elements receive the set signal $\phi SE$ and reset signal $\phi RE$. The NOR gate 431-2 receives a signal from a node 5a-1 of the front element and a signal from a node 5a-4 of its own. A signal $\phi R$ resets the delay controller. The signal $\phi R$ is once set to low when a power source is turned on and is fixed to high thereafter.

Figure 15:
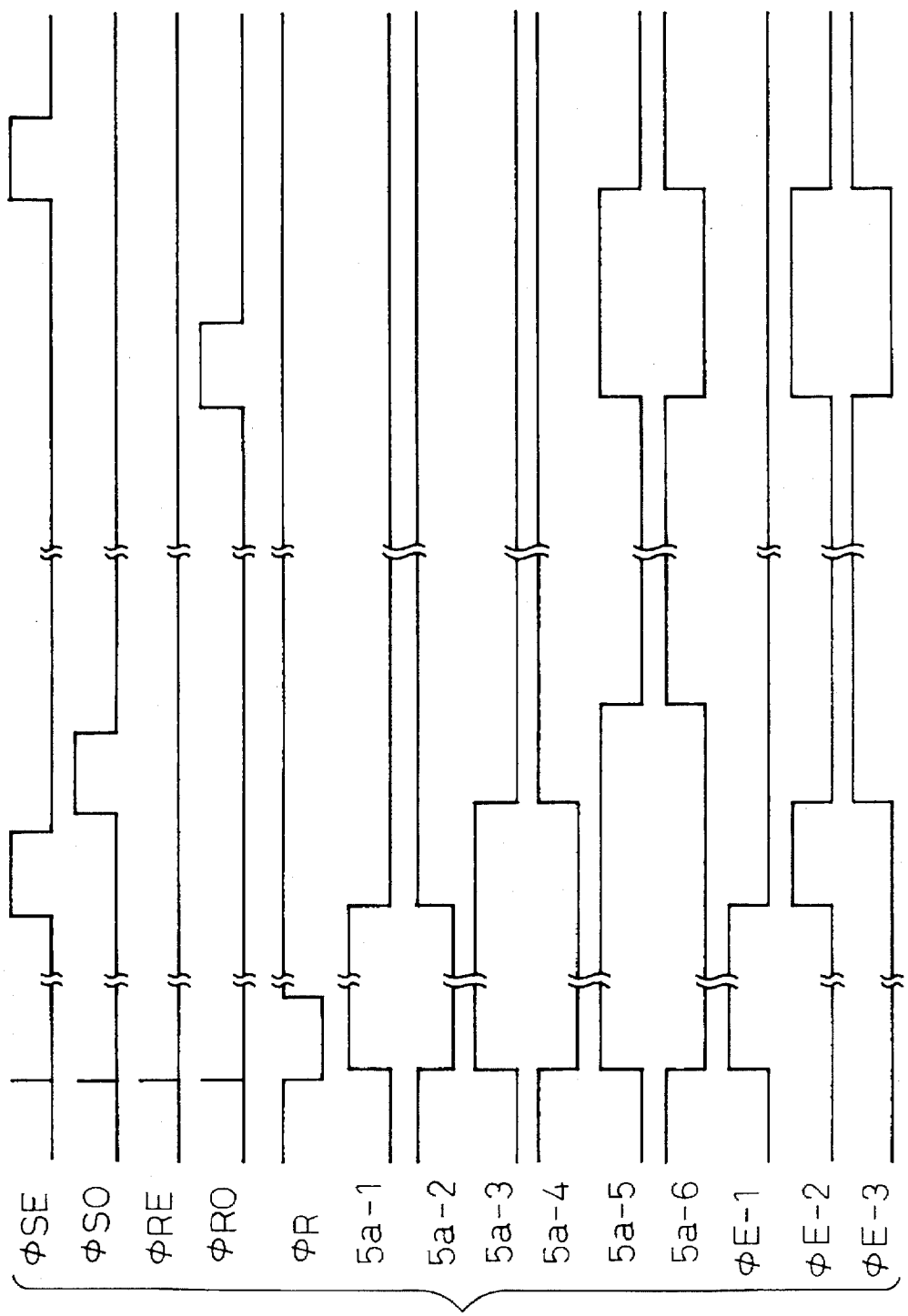
FIG. 15 is a timing chart showing the operation of the control section of FIG. 14.

FIG. 15 is a timing chart showing the operation of the circuit of FIG. 14.

The reset signal $\phi R$ is once set to low so that the nodes 5a-1, 5a-3, and 5a-5 are set to high and the nodes 5a-2, 5a-4, and 5a-6 to low. To carry out an incremental operation, the incremental signals, i.e., the set signals $\phi SE$ and $\phi SO$ are set to high and low alternately.

When the set signal $\phi SE$ is changed from low to high, the node 5a-1 is grounded to low, and the node 5a-2 is changed to high. Accordingly, the enable signal $\phi E$-1 changes from high to low. This state is latched by the flip-flop, and therefore, the enable signal $\phi E$-1 keeps the low level even if the set signal $\phi SE$ returns to low. When the node 5a-1 changes to low, the enable signal $\phi E$-2 changes from low to high. When the node 5a-2 changes to high, the transistor 438-2 is turned on. When the set signal $\phi SO$ changes from low to high, the node 5a-3 is grounded to low, and the node 5a-4 changes to high. As a result, the enable signal $\phi E$-2 changes from high to low. This state is latched by the flip-flop, and therefore, the enable signal $\phi E$-2 keeps the low level even if the set signal $\phi SO$ returns to low.

When the node 5a-3 changes to low, the enable signal $\phi E$-3 changes from low to high. Although FIG. 15 shows each one pulse of the set signals $\phi SE$ and $\phi SO$, many 1-bit control elements are connected to one another in reality.

Accordingly, if the set signals $\phi SE$ and $\phi SO$ are alternately set to high and low, the 1-bit control element that provides the enable signal $\phi E$ of high level will shift to the right sequentially. If the comparison result from the phase comparator 3 (8) indicates that a delay must be increased; the set signals $\phi SE$ and $\phi SO$ will alternately be set to high and low.

When the incremental (set) signals $\phi SE$ and $\phi SO$ and decremental (reset) signals $\phi RE$ and $\phi RO$ are kept low, a fixed 1-bit control element will provide an enable signal $\phi E$ of high level. Accordingly, if the comparison result from the phase comparator 3 (8) indicates to keep a delay, the signals $\phi SE$, $\phi SO$, $\phi RE$, and $\phi RO$ are held low.

When carrying out a decremental operation, the reset signals $\phi RE$ and $\phi RO$ are alternately provided so that the 1-bit control element that provides the enable signal $\phi E$ of high level may shift to the left sequentially.

In this way, the control section of FIG. 14 of the delay controller shifts the 1-bit control element that provides an enable signal $\phi E$ of high level element by element, to control the 1-bit delay elements of FIG. 13C element by element.

Figure 16:
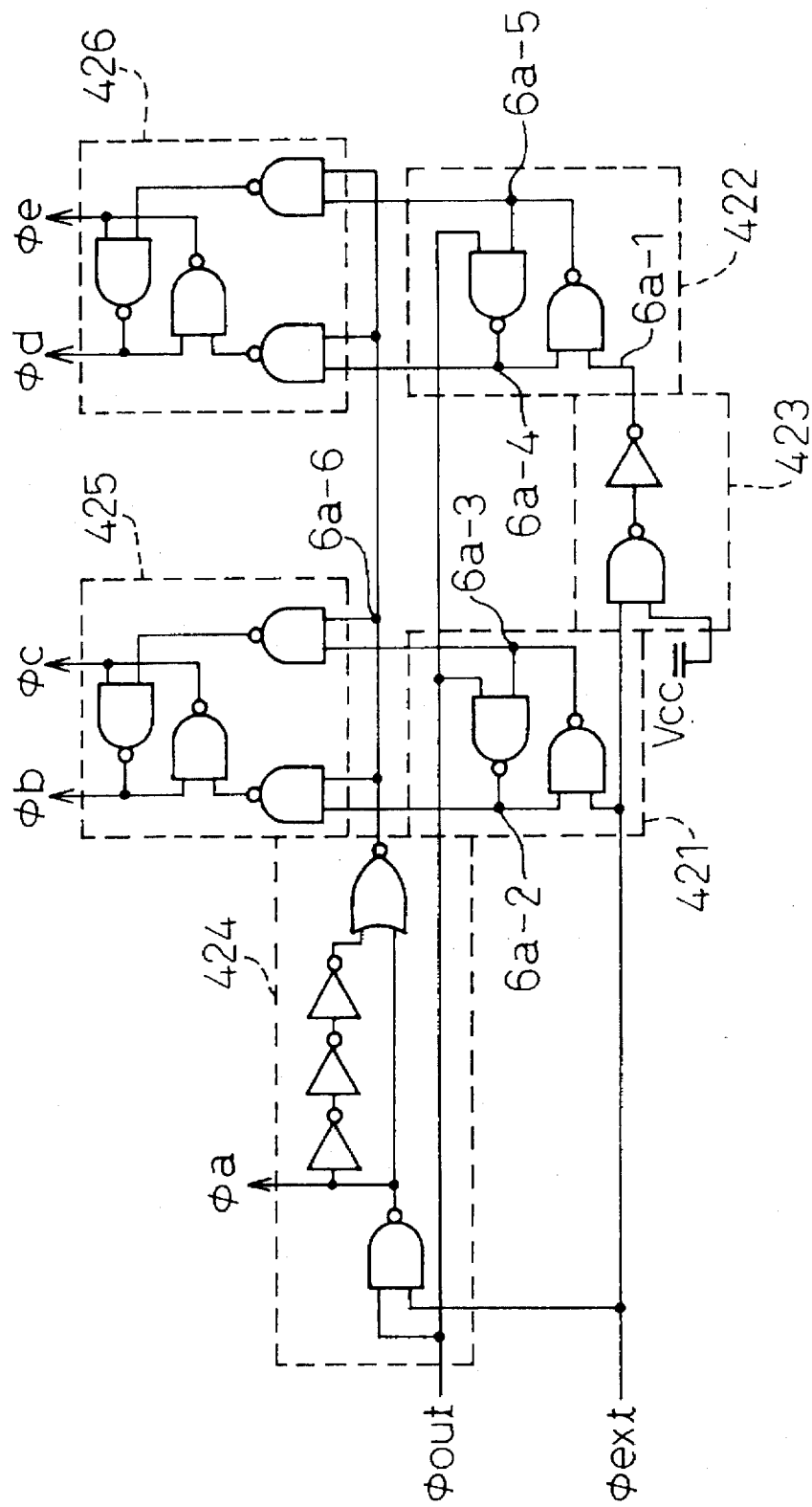
FIG. 16 shows a phase comparing section of a phase comparator of the circuit of FIG. 12.

FIG. 16 shows a phase comparing section of the phase comparator 3 (8) according to the present invention, and FIGS. 17A to 17C are timing charts showing the operation of the phase comparing section.

Figure 18:
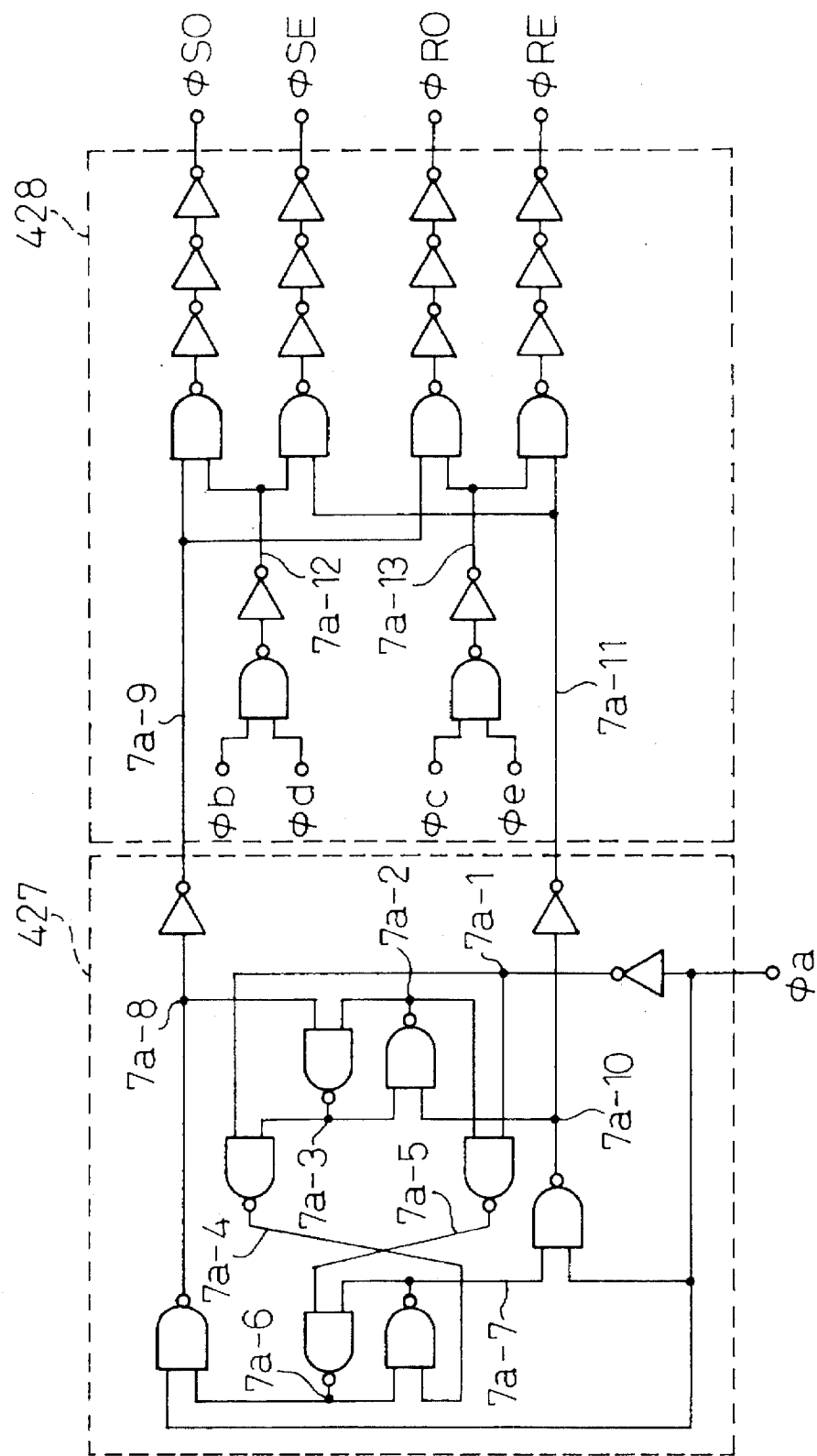
FIG. 18 shows an amplifying section of the phase comparator of the circuit of FIG. 12.

The phase comparator 3 (8) consists of the phase comparing section of FIG. 16 and an amplifying section of FIG. 18.

In FIG. 16, the phase comparing section compares the dummy internal clock signal $\phi out$ with the external clock signal $\phi ext$ serving as a reference signal. Output signals $\phi a$ to $\phi e$ are transferred to the amplifying section.

The phase comparing section is composed of flip-flops 421 and 422 each having two NAND gates, latches 425 and 426 for latching the states of the flip-flops 421 and 422, respectively, a generator 424 for generating an activation signal for the latches 425 and 426, and a 1-delay circuit 423 for obtaining a phase allowance for the external clock signal $\phi ext$.

FIG. 17A shows that the phase of the dummy internal clock signal $\phi out$ is ahead of the phase of the reference signal $\phi ext$. Namely, the signal $\phi out$ changes from low to high before the signal $\phi ext$ shows the same change. When the signals $\phi out$ and $\phi ext$ are each at low level, nodes 6a-2 to 6a-5 of the flip-flops 421 and 422 are each high. When the signal $\phi out$ changes from low to high, the nodes 6a-2 and 6a-4 change from high to low. Thereafter, the signal $\phi ext$ changes from low to high, and after one unit delay, the node 6a-1 changes from low to high. In spite of these changes, the terminal voltages of the flip-flops 421 and 422 are unchanged because they are already fixed. As a result, the node 6a-2 is continuously low, 6a-3 high, 6a-4 low, and 6a-5 high.

When the signal $\phi ext$ changes from low to high, the output signal $\phi a$ of the generator 424 changes from high to low, to apply a high pulse to the node 6a-6. Since the node 6a-6 is connected to the NAND gates of the latches 425 and 426, the NAND gates are temporarily activated, and the latches 425 and 426 latch the terminal voltages of the flip-flips 421 and 422. As a result, the output signal $\phi b$ changes to high, $\phi c$ to low, $\phi d$ to high, and $\phi e$ to low.

FIG. 17B shows that the dummy internal clock signal $\phi out$ and reference signal $\phi ext$ have substantially the same phase and change from low to high substantially at the same time. Within a time difference between a rise of the signal $\phi out$ and a rise of the node 6a-1, the signal $\phi out$ changes from low to high. At this time, the signal φext changes from low to high; so that the node 6a-3 of the flip-flop 421 changes from high to low. In the flip-flop 422, the node 6a-1 maintains low level, and the node 6a-4 changes from high to low. Thereafter, the node 6a-1 changes from low to high. At this time, the state of the flip-flop 422 is unchanged. The node 6a-6 provides a high pulse, and the latches 425 and 426 store the states. As a result, the output signal φb changes to low, φc to high, φd to high, and φe to low.

FIG. 17C shows that the phase of the dummy internal clock signal φout is behind the phase of the reference signal φext and that the signal φout changes from low to high after the same change in the signal φext. In this case, the signal φext causes changes in the flip-flops 421 and 422, and the nodes 6a-3 and 6a-5 change from high to low. As a result, the output signal φb changes to low, φc to high, φd to low, and φe to high.

In this way, a rise of the reference signal φext is used to determine whether a rise of the dummy internal clock signal φout is ahead, simultaneous, or behind. The determination is latched as values of the output signals φb, φc, φd, and φe. According to these values, it is determined to increment or decrement delays in the delay controllers.

Figure 19:
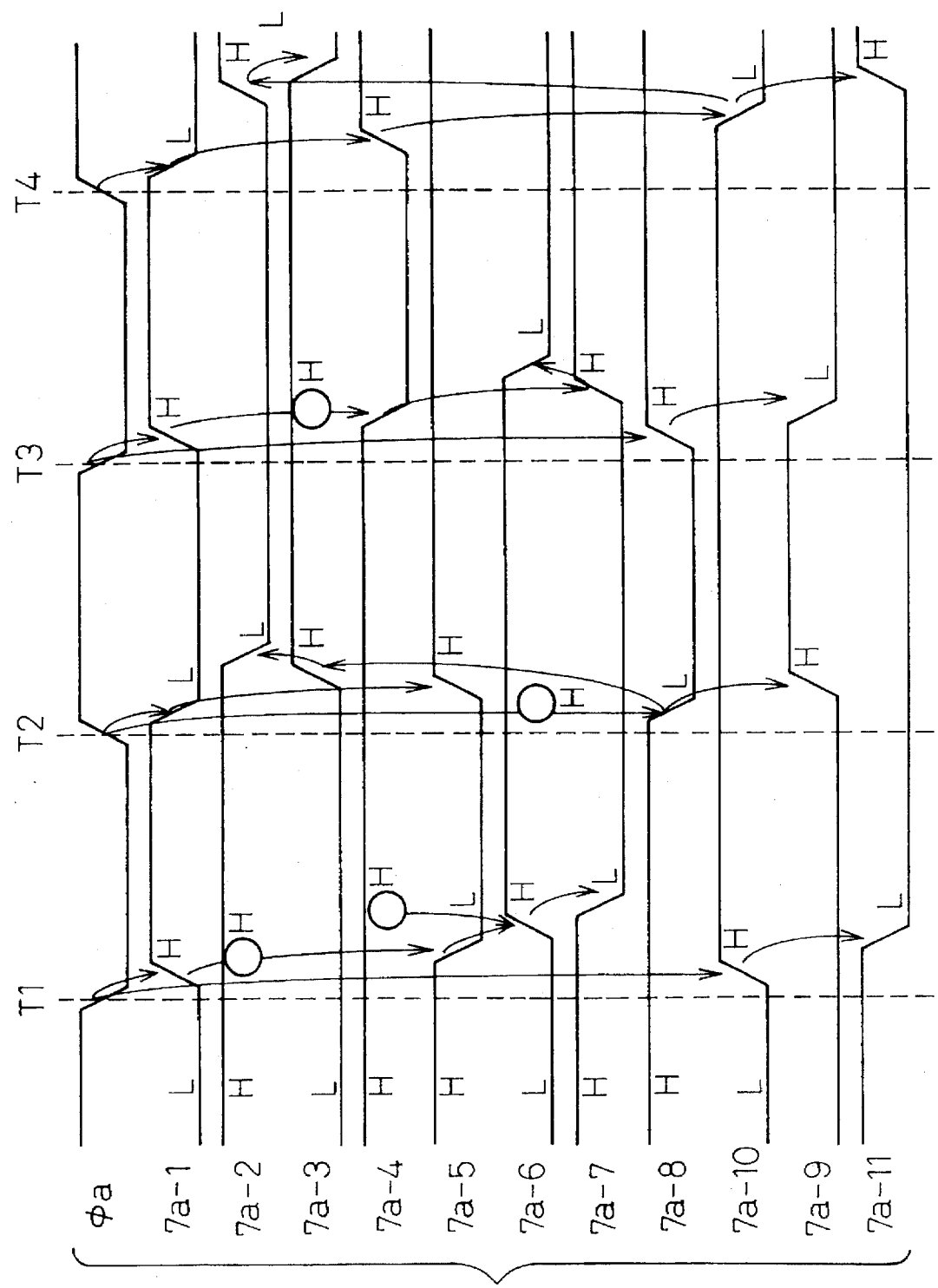
FIG. 19 is a timing chart showing the operation of a JK flip-flop of the amplifying section of FIG. 18.

FIG. 18 shows the amplifying section of the phase comparator 3 (8) of the present invention, and FIG. 19 is a timing chart showing the operation of a JK flip-flop of the amplifying section.

The amplifying section has the JK flip-flop 427 and an amplifier 428 consisting of NAND gates and inverters. The JK flip-flop 427 receives the output signal φa from the phase comparing section of FIG. 16. In response to the level of the signal φa, the voltages of nodes 7a-9 and 7a-11 alternate high and low levels. The amplifier 428 receives and amplifies the outputs of the JK flip-flip 427 and the signals φb to φe.

The operation of the JK flip-flop 427 will be explained with reference to the timing chart of FIG. 19. The signal φa changes from high to low at time T1, and then, nodes 7a-1 and 7a-10 change from low to high. Nodes 7a-5, 7a-6, and 7a-7 change in response to the change at the node 7a-1, but a node 7a-8 shows no change because the signal φa is low. As a result, the output node 7a-9 is unchanged, and the output node 7a-11 changes from high to low. At time T2, the signal φa changes from low to high, and then, the node 7a-8 changes from high to low. The node 7a-10 is unchanged because the node 7a-7 is unchanged. The output node 7a-9 changes from low to high, and the output node 7a-11 is unchanged. In this way, the output nodes 7a-9 and 7a-11 of the JK flip-flop 427 alternately change from high to low and from low to high.

Figure 20:
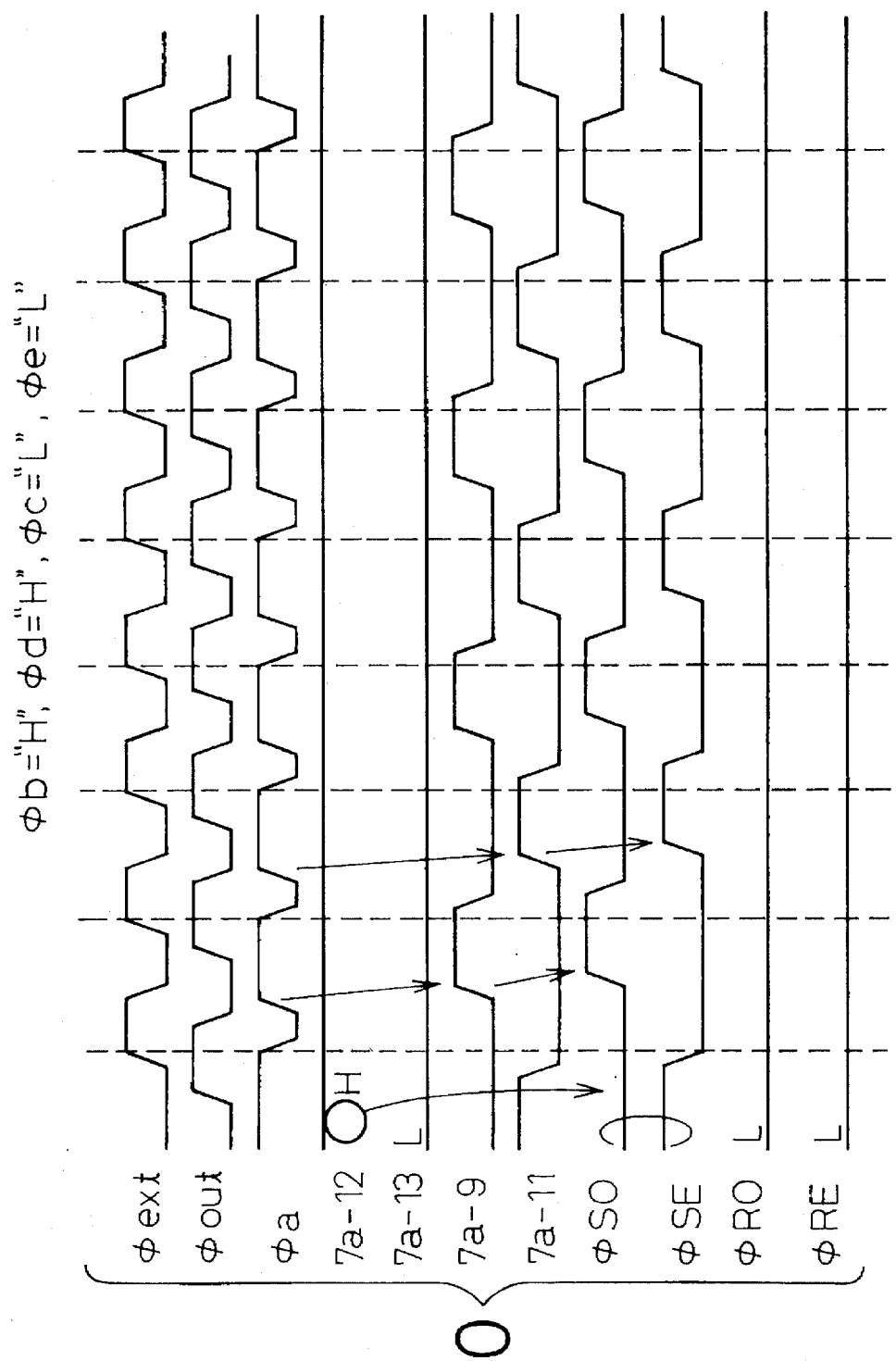
FIG. 20 is a timing chart showing an incremental operation of the amplifying section of FIG. 18.
Figure 21:
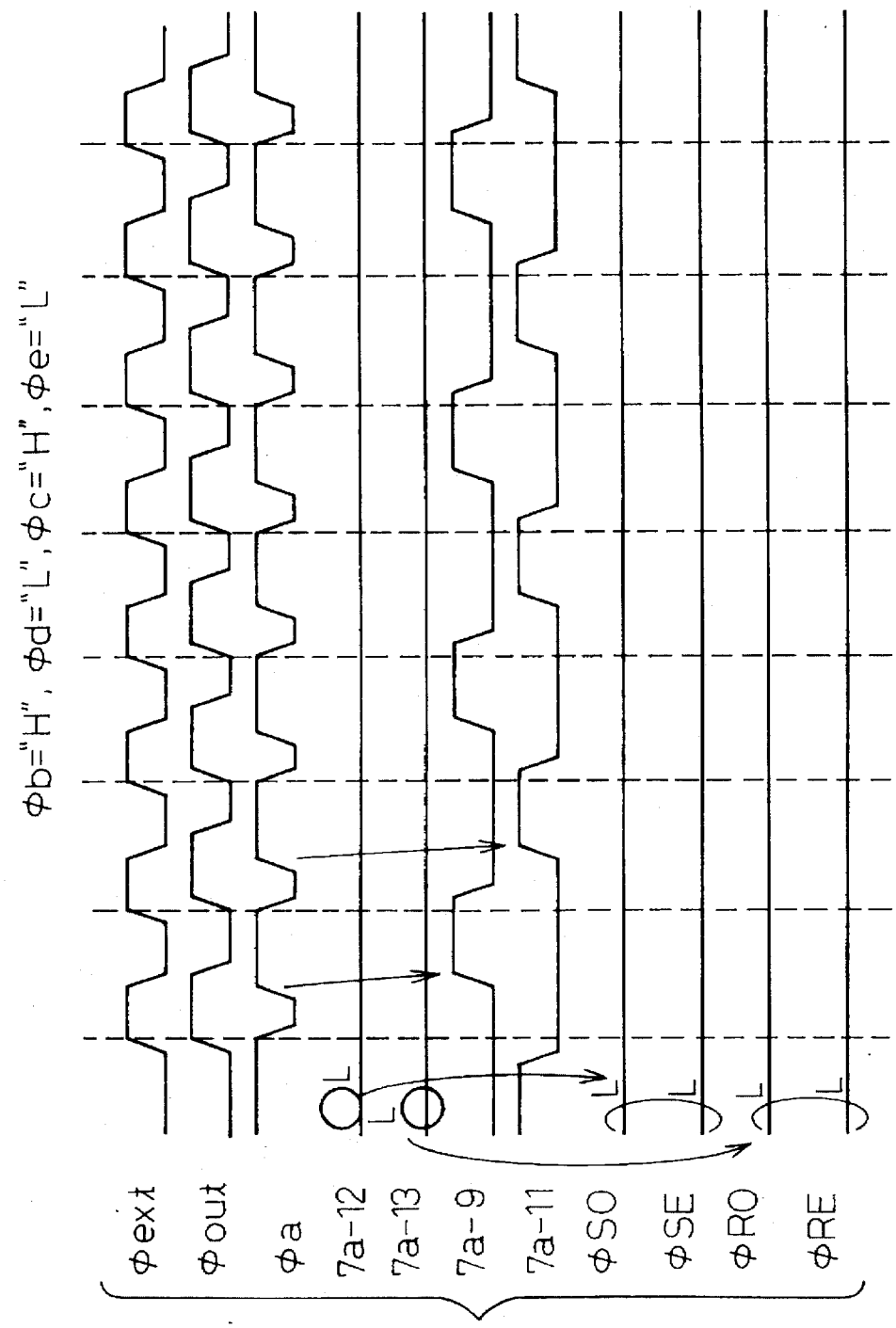
FIG. 21 is a timing chart showing a sustain operation of the amplifying section of FIG. 18.
Figure 22:
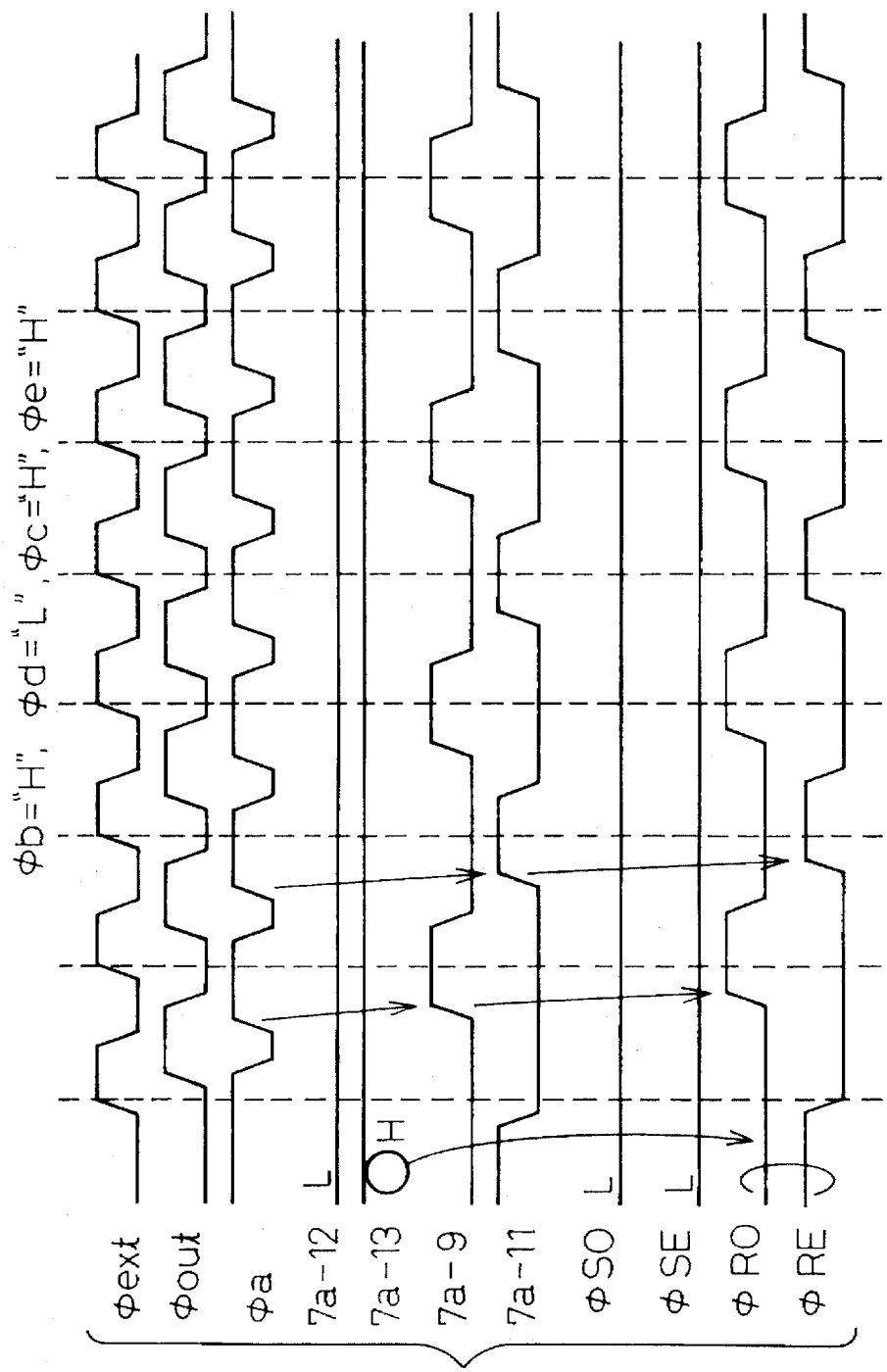
FIG. 22 is a timing chart showing a decremental operation of the amplifying section of FIG. 18.

FIG. 20 is a timing chart showing an incremental operation of the amplifying section of FIG. 18 of the phase comparator, FIG. 21 is a timing chart showing a sustain operation of the same, and FIG. 22 is a timing chart showing a decremental operation of the same.

In FIG. 20, the dummy internal clock signal φout changes from low to high before the same change in the reference signal φext. In this case, the phase comparing section of FIG. 16 provides the signal φb of high, φc of low, φd of high, and φe of low. As a result, a node 7a-12 12 becomes high, and a node 7a-13 is fixed at low. Although the incremental (set) signals φSO and φSE change in response to the state of the JK flip-flop 427, the decremental (reset) signals φRO and φRE are unchanged because the node 7a-13 is low.

In FIG. 21, the signal φout changes from low to high substantially simultaneously with the reference signal φext. In this case, the phase comparing section of FIG. 16 provides the signal φb of low, φc of high, φd of high, and φe of low. As a result, the nodes 7a-12 and 7a-13 are fixed at low. The set signals φSO and φSE are not influenced by the output of the JK flip-flop, and therefore, the signals φSO, φSE, φRO, and φRE are fixed at low.

In FIG. 22, the signal φout changes from low to high behind the same change in the reference signal φext. In this case, the phase comparing section of FIG. 16 provides the signal φb of low, φc of high, φd of low, and φe of high. As a result, the node 7a-12 is fixed at low, the node 7a-13 is fixed at high, the reset signals φRO and φRE change in response to the state of the JK flip-flop, and the set signals φSO and φSE are unchanged because the node 7a-12 is low.

Figure 23:
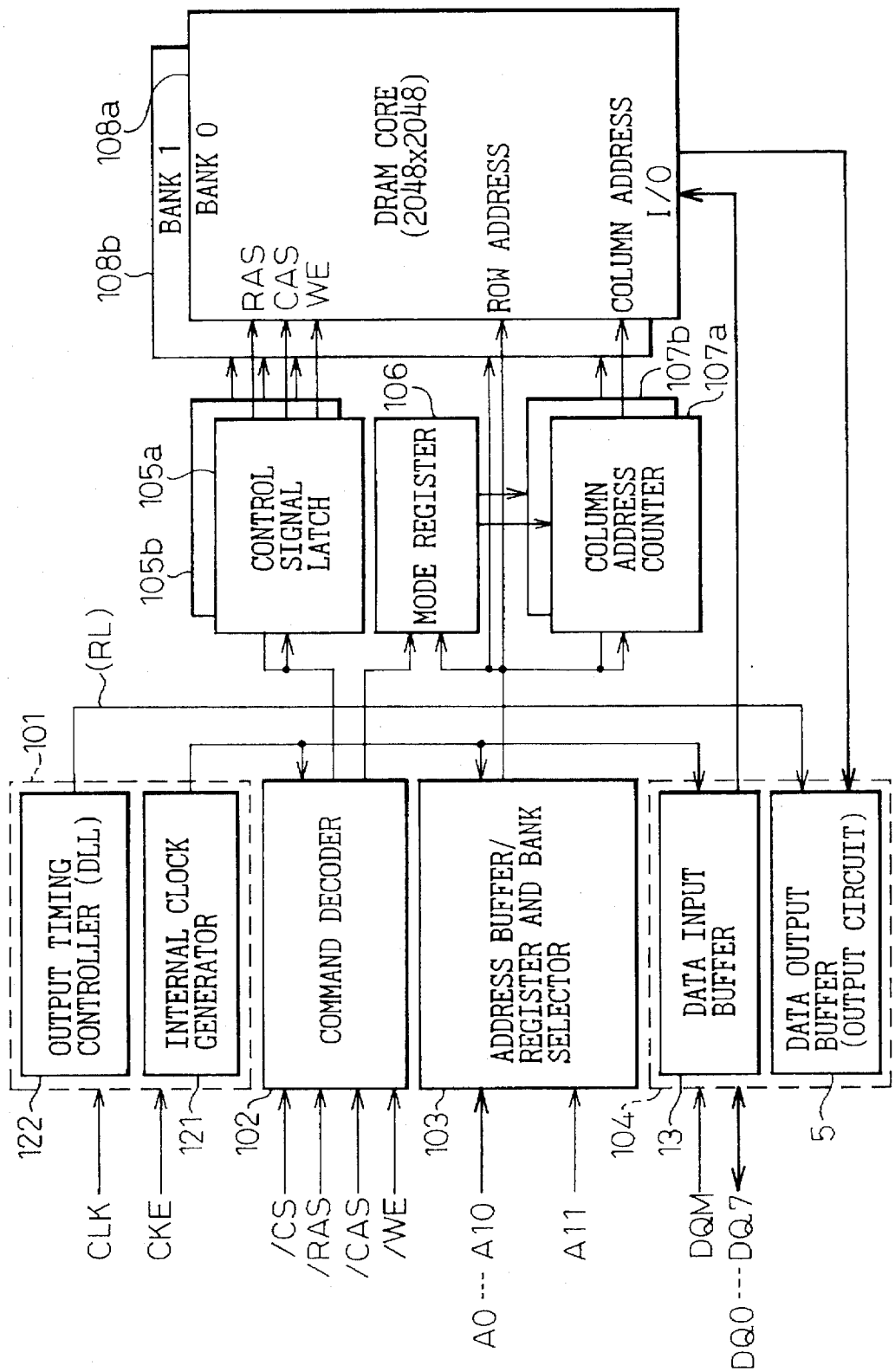
FIG. 23 is a block diagram showing a synchronous DRAM according to the present invention.
Figure 24:
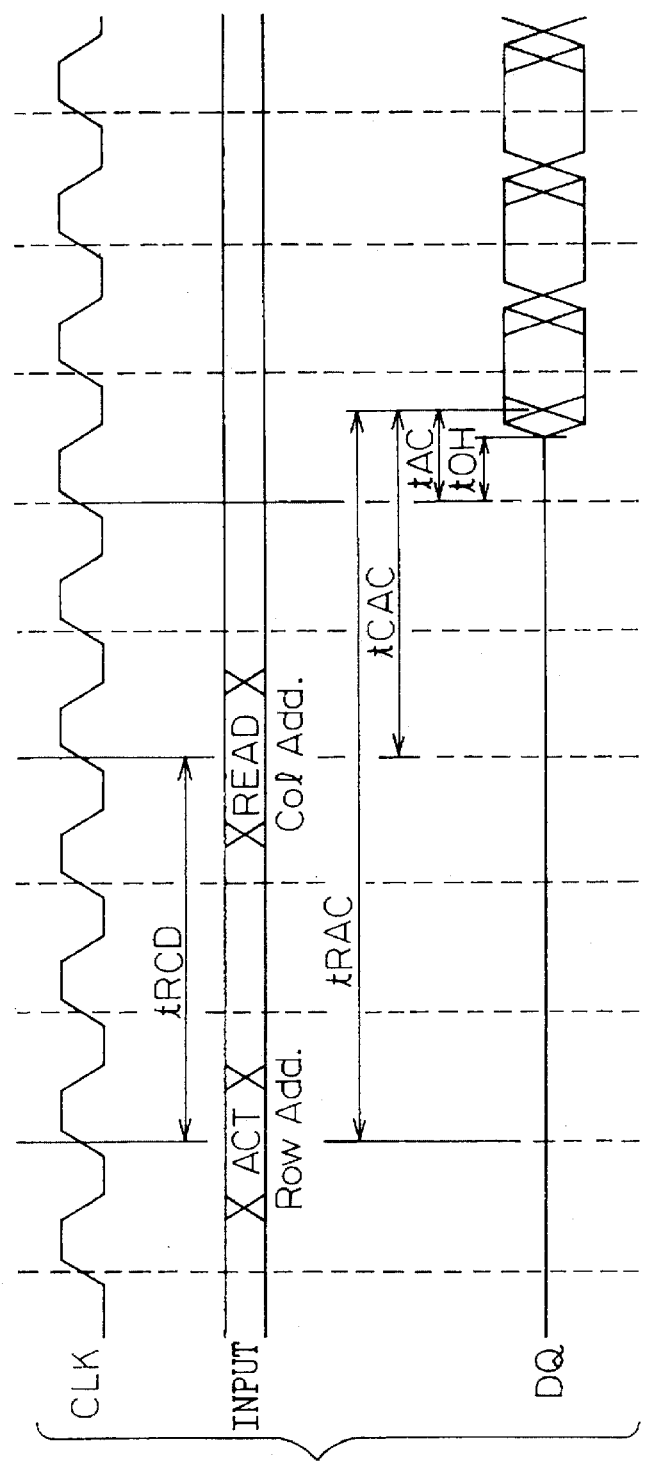
FIG. 24 is a timing chart showing the operation of the synchronous DRAM of FIG. 23.

FIG. 23 shows an SDRAM according to the present invention, and FIG. 24 is a timing chart showing the operation of the SDRAM.

The SDRAM employs a pipeline method and is a 2-bank, 8-bit, 16-M SDRAM.

The SDRAM has DRAM cores 108a and 108b, a clock buffer 101, a command decoder 102, an address buffer/register and bank address selector 103, an I/O data buffer/register 104, control signal latches 105a and 105b, a mode register 106, and column address counters 107a and 107b. Signals /CS, /RAS, /CAS, and /WE are combined to form a command that specifies an operation mode. The command is decoded by the command decoder 102, and according to a mode specified by the command, circuits are controlled. The signals /CS, /RAS, /CAS, and /WE are also supplied to the latches 105a and 105b that maintain their states until the next command is provided.

Address signals are amplified by the address buffer 103, which provides row addresses for the banks as well as initial addresses for the column address counters 107a and 107b.

The clock buffer 101 has an internal clock generator 121 and an output timing controller 122, which is the DLL circuit of the present invention. The internal clock generator 121 generates an ordinary internal clock signal according to an external clock signal. CLK. The output timing controller 122 generates a delay-locked (phase-locked) clock signal after carrying out the delay control of the present invention mentioned above.

The register 104 has a data input buffer 13 and a data output circuit 5 including output circuits 50 to 57. The data output circuit 5 amplifies data read out of the DRAM cores 108a and 108b and provides the data through output pads DQ0 to DQ7 according to the delay-locked clock signal provided by the output timing controller 122. Input data to the pads DQ0 to DQ7 are received by the data input buffer 13. A real line (RL) runs between the output timing controller 122 and the data output circuit 5.

FIG. 24 shows a read operation of the SDRAM of FIG. 23.

The external clock signal CLK is supplied from a system to the SDRAM. In synchronization with a rise of the clock signal CLK, the SDRAM reads commands, address signals, and input data and provides output data.

When reading data out of the SDRAM, the command signals /CS, /RAS, /CAS, and /WE are combined to form an active command (ACT), which is supplied to a command terminal. At the same time, a row address signal is supplied to an address terminal. Then, the SDRAM is activated to select a word line corresponding to the row address, provides corresponding cell data to a corresponding bit line, and amplifies the data by a sense amplifier.

After an operation time tRCD related to the row address, a read command and a column address are supplied to the SDRAM. The SDRAM selects sense amplifier data according to the column address, supplies the data to a data bus line, amplifies the data by a data bus amplifier, further amplifies the data by the output buffer, and transfers the data to the output terminal DQ. These operations are the same as those of a standard DRAM. In the SDRAM, circuits related to a column address carry out a pipeline operation, and read data is continuously provided. Accordingly, a data transfer speed is determined by the period of the external clock signal.

The SDRAM involves three kinds of access time each of which is defined according to a rise of the clock signal CLK. In FIG. 24, there are row address access time tRAC, column address access time tCAC, and clock signal access time tAC. When the SDRAM is used in a high-speed memory system, tRAC and tCAC are important because they determine a period between command input and first data output. The clock signal access time tAC is also important.

Figure 25:
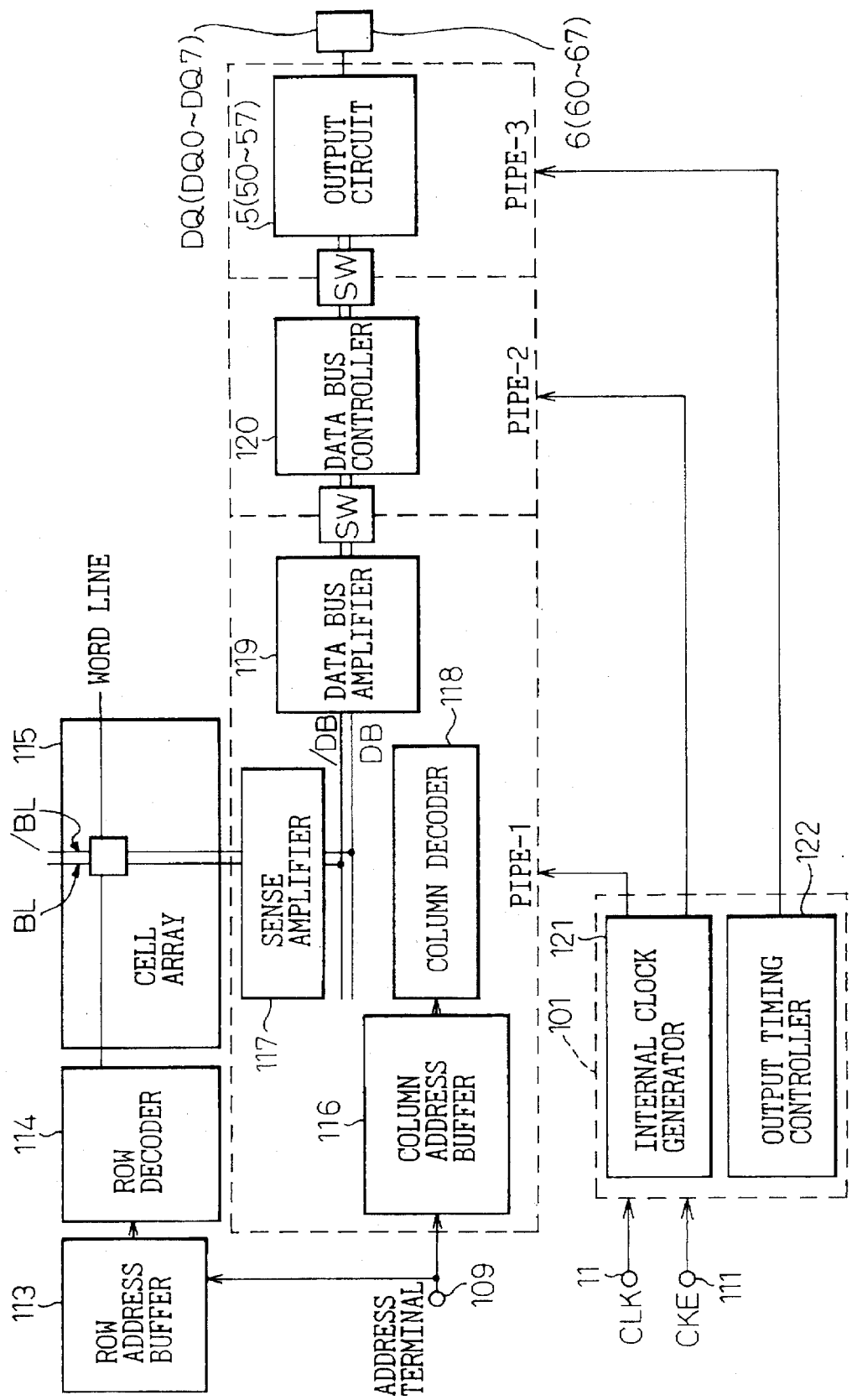
FIG. 25 is a block diagram showing essential parts of the synchronous DRAM of FIG. 23.

FIG. 25 is a block diagram showing essential parts of the SDRAM of FIG. 23 and explains a pipeline operation thereof with, for example, three pipes.

The circuit for processing a column address in the SDRAM is divided into several sections along a processing flow. Each of the divided sections is called a pipe.

As explained with reference to FIG. 23, the buffer 101 has the internal clock generator 121 and output timing controller 122. The internal clock generator 121 generates an ordinary internal clock signal, which is supplied to the pipes 1 and 2. The output timing controller 122 provides a delay-locked (phase-locked) internal clock signal to the output circuit 5 (data output circuits 50 to 57) of the pipe 3.

The supplied internal clock signals control the corresponding pipes. Between the pipes, there is a switch for controlling the transmission timing of a signal between the pipes. These switches are controlled according to the internal clock signal generated by the generator 121.

In the pipe 1, a column address buffer 116 amplifies an address signal and sends it to a column decoder 118. The column decoder 118 selects an address. Data at the address is amplified by a sense amplifier 117 and then is supplied to a data bus. The data on the data bus is amplified by a data bus amplifier 119. The pipe 2 involves only a data bus controller 120. The pipe 3 involves the I/O buffer 104 (output circuit 5). The data input buffer 13 in the I/O buffer 104 is not shown in FIG. 25.

The circuit(s) in each pipe completes its operation within a clock cycle, and the switch between the pipes is opened and closed in synchronization with the clock signal, to relay data. As a result, the pipes process data in parallel, and data is continuously sent to the output terminal in synchronization with the clock signal.

Figure 26:
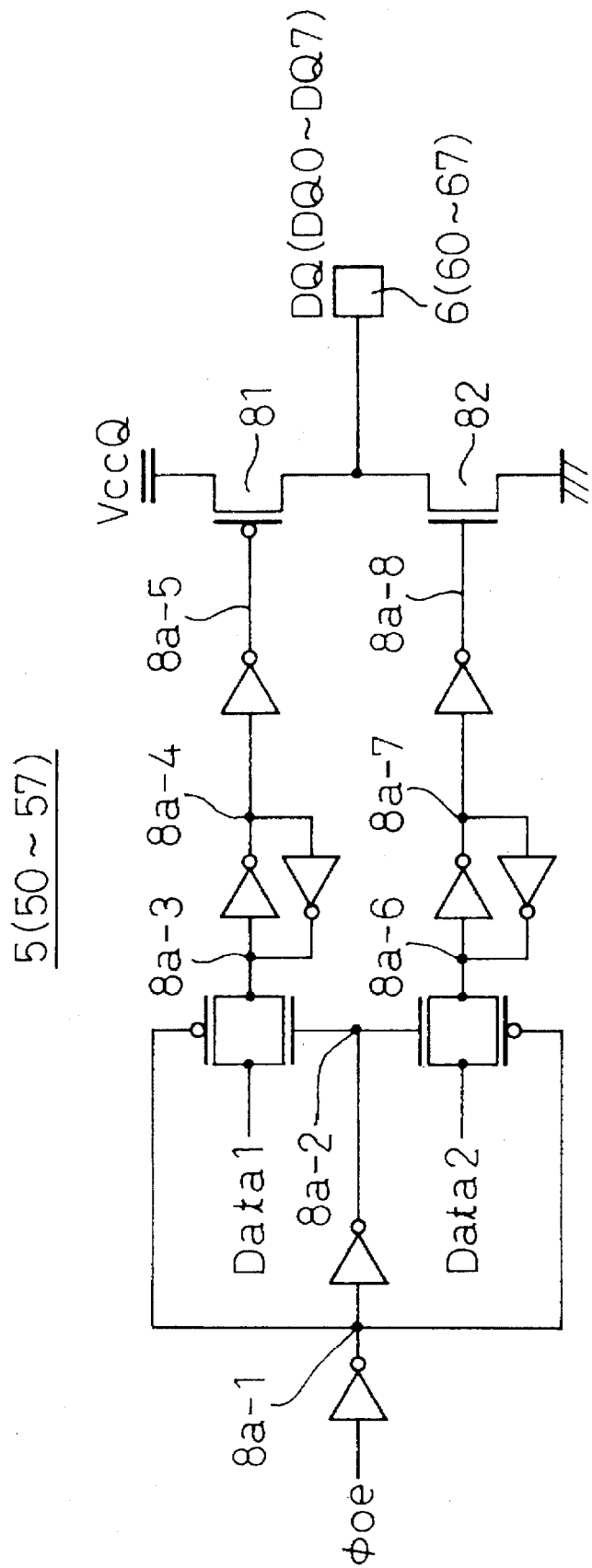
FIG. 26 is a circuit diagram showing a data output buffer of the circuit of FIG. 25.

FIG. 26 shows an example of the output circuit 5 (output circuits 50 to 57) of FIG. 25. Signals Data1 and Data2 correspond to data read out of a cell array 115 through the sense amplifier 117, data bus amplifier 119, and data bus controller 120 of FIG. 25. The signals Data1 and Data2 are each low when the read data is high and are each high when the read data is low. If the read data is not high nor low under a high-impedance (high-Z) state, the data bus controller 120 sets the signal Data1 to high and the signal Data2 to low. A signal φoe corresponds to the internal clock signal from the output timing controller 122 (the primary delay controller 21) and serves as an enable signal for the output circuit 5 (output circuits 50 to 57).

When the clock signal φoe becomes high, the signals Data1 and Data2 appear at the data output pad 6 (output pads 60 to 67). When letting the output pad 6 provide a signal of high level, the signal φoe changes from low to high, a node 8a-1 to low, and a node 8a-2 to high, to turn on transfer gates. Then, the signals Data1 and Data2 are transferred to nodes 8a-3 and 8a-6. As a result, a node 8a-5 changes to low and a node 8a-8 to high, to turn on a p-channel transistor 81 and off an n-channel transistor 82. Consequently., the data output pad 6 provides a signal of high level. When the signal φoe changes to low, the transfer gates are turned off to hold the current output state.

FIG. 27 shows an example of the dummy line 42 (FIG. 12) according to the present invention. The dummy line 42 is formed on a chip and has the same width as the real line 41 (FIG. 12). Any dummy line may be replaced with a combination of capacitors or resistors.

The present invention is applicable not only to SDRAMs but also to any semiconductor integrated circuits. The number of delay controllers in the delay signal generator 31 is not limited to three nor the number of intermediate delay controllers to one. The delay signal generator 31 may have four, five, six, or more delay controllers. An output signal of any delay controller except the final delay controller may be used as a signal to the pulse signal generator 33. A pulse signal generated by a semiconductor integrated circuit according to the present invention is used not only as a control signal but also as any other signal.

As explained above in detail, the present invention provides a semiconductor integrated circuit having a plurality of delay controllers for dividing an external control signal, and a pulse signal generator for processing an output signal of one of the delay controllers and the control signal, to provide a pulse signal whose pulse width is dependent on the period of the external control signal and a value specific to the output signal. Namely, the present invention is able to change the pulse width of the pulse signal according to a change in the frequency of the control signal.

Many different embodiments of the present invention may be constructed without departing from the spirit and scope of the present invention, and it should be understood that the present invention is not limited to the specific embodiments described in this specification, except as defined in the appended claims.

What is claimed is:

1. A semiconductor integrated circuit comprising:
   a primary delay controller for receiving an external control signal;
   at least one intermediate delay controller cascaded to said primary delay controller;
   a final delay controller cascaded to said intermediate delay controller;
   a phase comparator for comparing a phase of the external control signal with a phase of an output signal of said final delay controller, and for controlling delays in said primary, intermediate, and final delay controllers in accordance with the comparison result; and
   a pulse signal generator for receiving the external control signal and an output signal of any one of said primary and intermediate delay controllers, and for providing a pulse signal whose pulse width is dependent on a period of the external control signal and a value specific to the received output signal.

2. A semiconductor integrated circuit as claimed in claim 1, wherein said phase comparator controls delays in said primary, intermediate, and final delay controllers so as to make the phase of an output signal of said final delay controller agree with a phase of the external control signal.

3. A semiconductor integrated circuit as claimed in claim 1, wherein said semiconductor integrated circuit is a synchronous DRAM, and the pulse signal generated by said pulse signal generator is a control pulse signal used to control read, write, and reset operation intervals of said synchronous DRAM.

4. A semiconductor integrated circuit as claimed in claim 1, wherein a duty factor of the pulse signal generated by said pulse signal generator is determined by a ratio of the number of delay controllers between said primary delay controller and said intermediate delay controller that provides its own output to said pulse signal generator to the total number of said primary, intermediate, and final delay controllers.

5. A semiconductor integrated circuit comprising:

a phase delayed signal generator for receiving an external control signal and generating a phase delayed signal whose phase is delayed from that of the external control signal by a given value; and a pulse signal generator for receiving the external control signal and the phase delayed signal and for generating a pulse signal whose pulse width is dependent on an period of the external control signal and a value specific to the phase delayed signal.

6. A semiconductor integrated circuit as claimed in claim 5, wherein said phase delayed signal generator includes:

a primary delay controller for receiving an external control signal;

at least one intermediate delay controller cascaded to said primary delay controller;

a final delay controller cascaded to said intermediate delay controller; and a phase comparator for comparing a phase of the external control signal with a phase of an output signal of said final delay controller, and for controlling delays in said primary, intermediate, and final delay controllers in accordance with the comparison result, wherein said phase delayed signal generator generates the phase delayed signal whose phase delay is determined according to the number of said primary, intermediate, and final delay controllers.

7. A semiconductor integrated circuit as claimed in claim 6, wherein a duty factor of the pulse signal generated by said pulse signal generator is determined by a ratio of the number of delay controllers between said primary delay controller and said intermediate delay controller that provides its own output to said pulse signal generator to the total number of said primary, intermediate, and final delay controllers.

8. A semiconductor integrated circuit as claimed in claim 5, wherein said semiconductor integrated circuit is a synchronous DRAM, and the pulse signal generated by said pulse signal generator is a control pulse signal used to control read, write, and reset operation intervals of said synchronous DRAM.

9. A semiconductor integrated circuit as claimed in claim 5, wherein said semiconductor integrated circuit further comprises a delay locked line circuit for receiving the phase delayed signal and for generating a signal phase-synchronized with the phase delayed signal.

10. A semiconductor integrated circuit as claimed in claim 9, wherein said delay locked line circuit includes:

first and second delay controllers for receiving the phase delayed signal;

a plurality of objects circuits for receiving an output signal of said first delay controller through a real line;

a dummy line for producing a dummy delay corresponding to a delay in said real line; and a second phase comparator for comparing a phase of the phase delayed signal with a phase of a dummy output signal from said second delay controller through said dummy line, for controlling delays in said first and second delay controllers in accordance with the comparison result.

11. A semiconductor integrated circuit as claimed in claim 10, wherein said delay locked line circuit provides a synchronous signal that is in synchronization with the external control signal and is phase-shifted therefrom depending on the phase delayed signal.

12. A semiconductor integrated circuit as claimed in claim 10, wherein said semiconductor integrated circuit is a synchronous DRAM, and the synchronous signal provided by said delay locked line circuit serves as an enable signal for a data output buffer circuit of said synchronous DRAM.

13. A semiconductor integrated circuit comprising:

a plurality of delay control circuits for dividing an external control signal;

a pulse signal generating circuit for processing the external control signal and an output signal of a predetermined one of said delay control circuits and for providing a pulse signal whose pulse width is dependent on a period of the external control signal and a value specific to the output signal, so as to vary the pulse width of the pulse signal in response to a change in a frequency of the external control signal.

14. A semiconductor integrated circuit comprising:

cascaded "n" variable delay circuits for receiving a control pulse signal;

a phase comparator for controlling a delay time of each of said "n" variable delay circuits so as to make a phase of an output signal through said "n" variable delay circuits agree with a phase of the control pulse signal; and a pulse signal generator for receiving the control pulse signal and a selected one of output signals of said "n" variable delay circuits and for generating a pulse signal whose pulse width corresponds to a phase difference of the two received signals.

* * * * *